United States Patent [19]

Shimizu et al.

[11] Patent Number: 4,873,559
[45] Date of Patent: Oct. 10, 1989

[54] SEMICONDUCTOR MEMORY DEVICE AND A PROCESS FOR PRODUCING THE SAME

[75] Inventors: Shinji Shimizu, Hoya; Osamu Tsuchiya, Ohme; Katsuyuki Sato, Kodaira, all of Japan

[73] Assignee: Hitachi, Ltd., Tokyo, Japan

[21] Appl. No.: 253,779

[22] Filed: Oct. 5, 1988

Related U.S. Application Data

[63] Continuation of Ser. No. 855,418, Apr. 24, 1986, abandoned.

[30] Foreign Application Priority Data

Apr. 24, 1985 [JP] Japan .................................. 60-86393
May 24, 1985 [JP] Japan ................................ 60-110361
May 24, 1985 [JP] Japan ................................ 60-110362

[51] Int. Cl.$^4$ ........................................... H01L 29/78
[52] U.S. Cl. .................... 357/23.6; 357/23.1; 357/23.11; 357/51; 357/59; 357/71
[58] Field of Search ...................... 357/23.6, 41, 23.1, 357/14, 23.11, 51, 59 E, 59 G, 59 I, 71 S

[56] References Cited

U.S. PATENT DOCUMENTS

| 4,455,566 | 6/1984 | Sakurai | 357/23.6 |
| 4,511,911 | 4/1985 | Kenney | 357/23.1 |
| 4,684,971 | 8/1987 | Payne | 357/23.1 |
| 4,688,064 | 8/1987 | Ogura et al. | 357/23.6 |

FOREIGN PATENT DOCUMENTS

| 58-182261 | 10/1983 | Japan | 357/23.6 |
| 59-130462 | 7/1984 | Japan | 357/23.6 |
| 60-196967 | 10/1985 | Japan | 357/23.6 |
| 61-3441 | 1/1986 | Japan | 357/23.6 |

Primary Examiner—Andrew J. James
Assistant Examiner—Ngan van Ngo
Attorney, Agent, or Firm—Antonelli, Terry & Wands

[57] ABSTRACT

Dynamic RAM having memory cells, each of the memory cells having a capacitor with the electrode comprised of a first semiconductor region of a first type of conductivity formed in a substrate of second conductivity type. The first semiconductor region is formed by introducing impurities using a mask comprising (1) a nitride film which is deposited so as to define part of the shape of the capacitor. An oxide film, formed by thermal oxidation of the substrate, defines the shape of the memory cells, and each of the memory cells further have at least a second semiconductor region of a second type of conductivity formed between and under the electrodes, the shape thereof being defined by the nitride film and the oxide film that is formed by thermal oxidation.

26 Claims, 30 Drawing Sheets

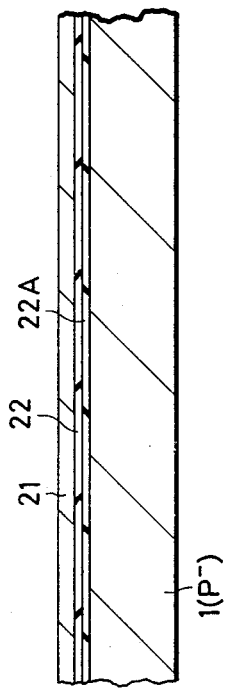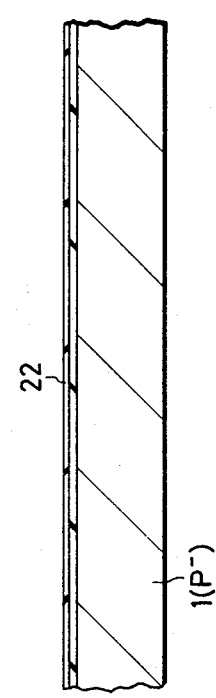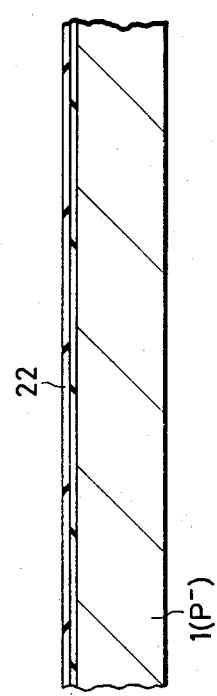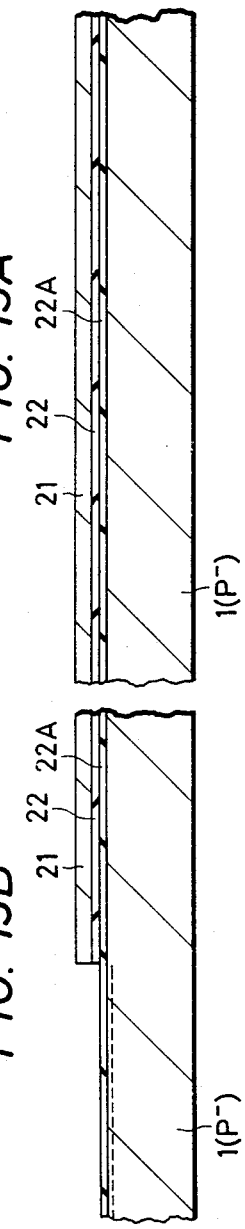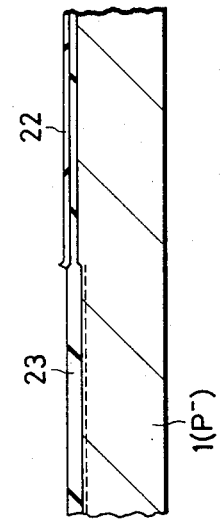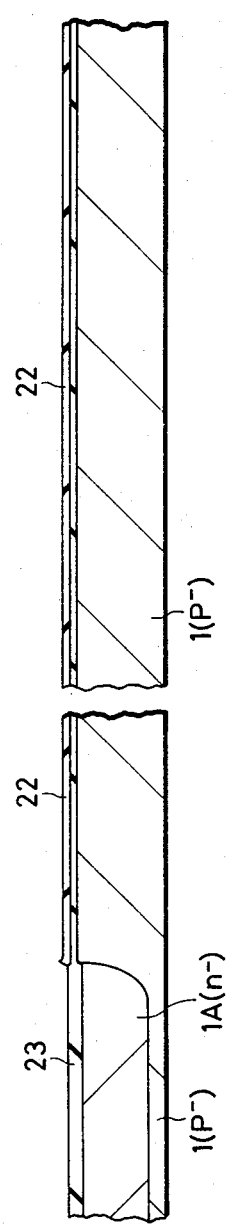

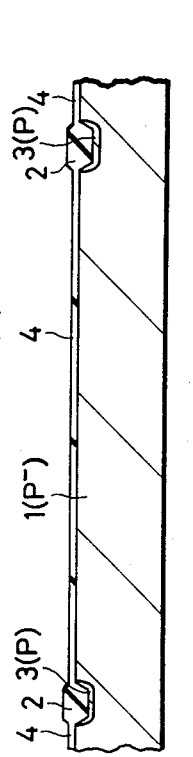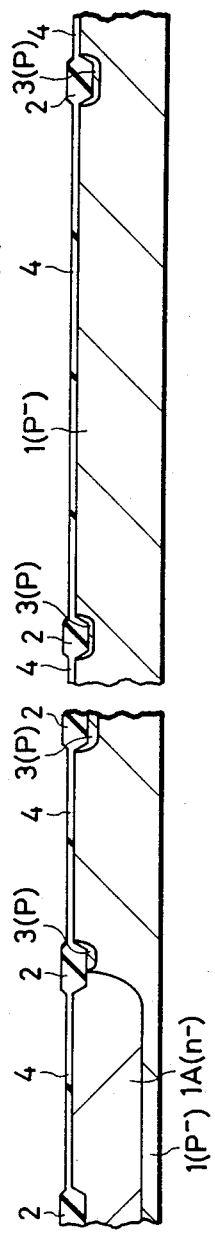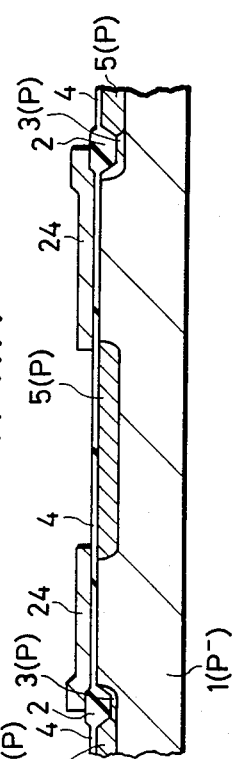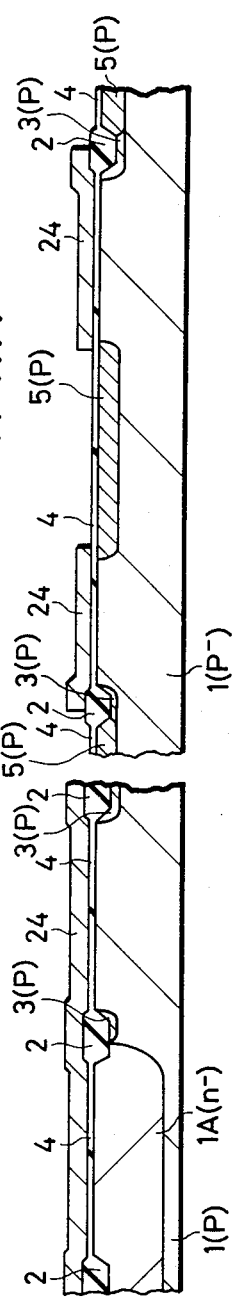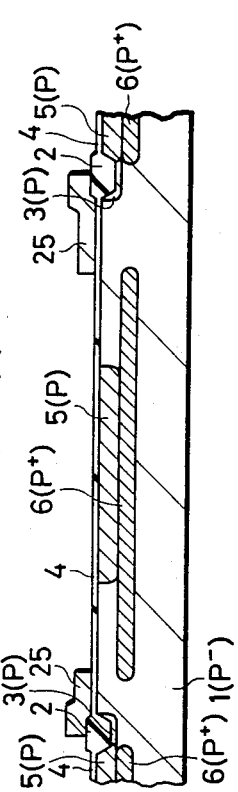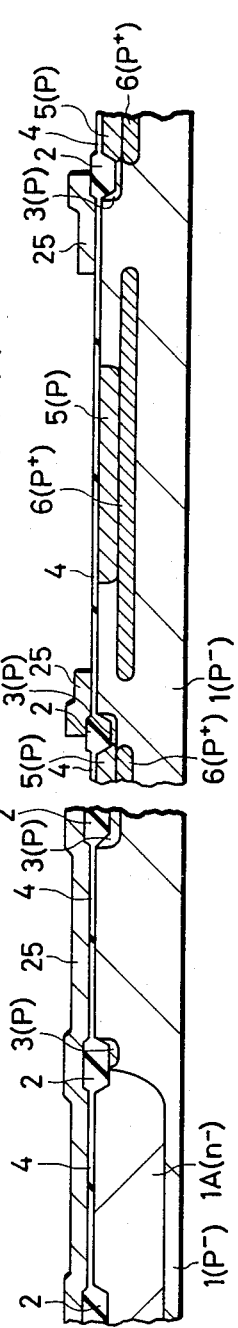

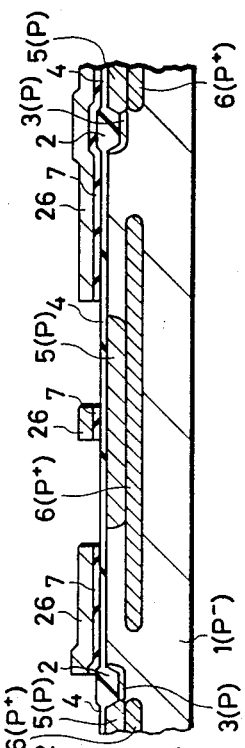
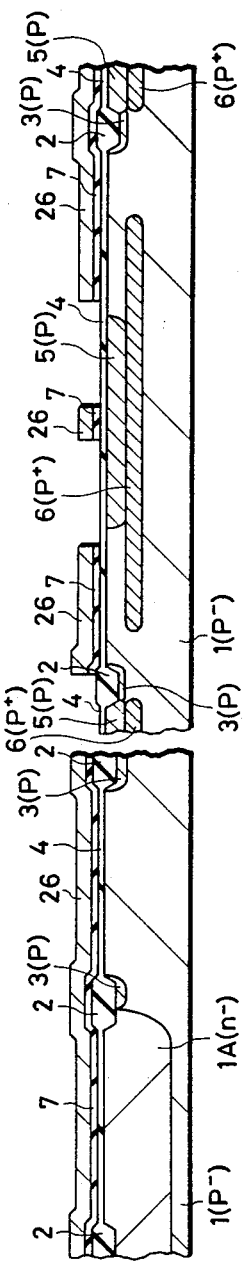
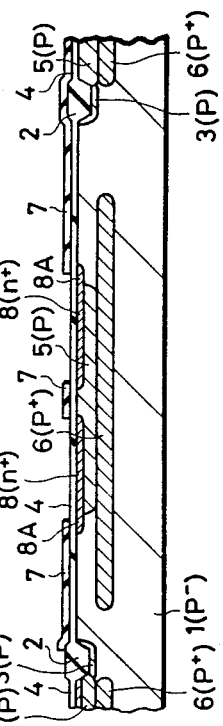
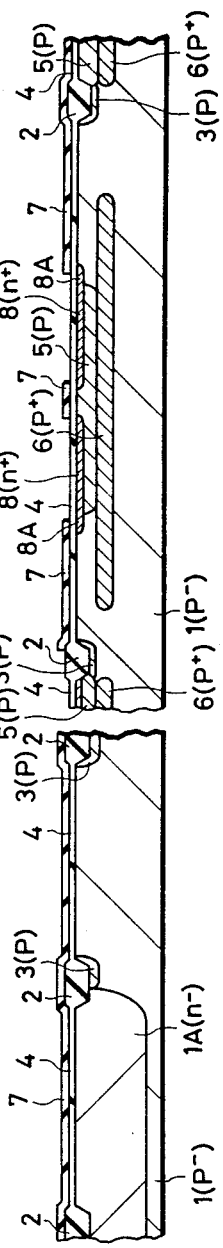
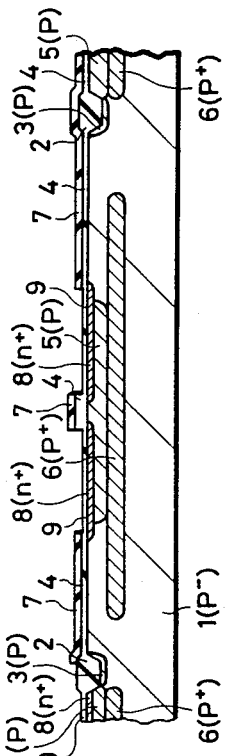

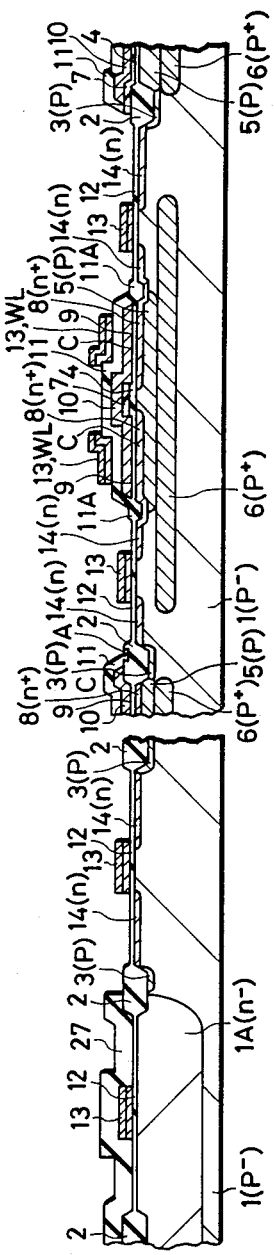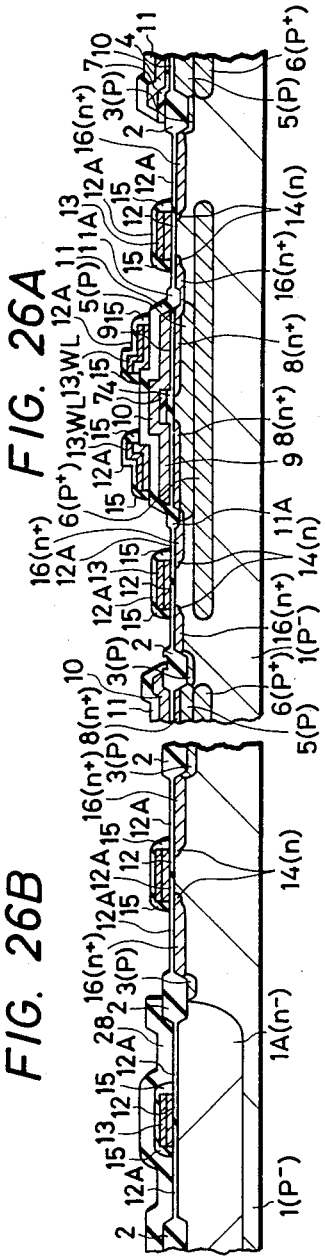

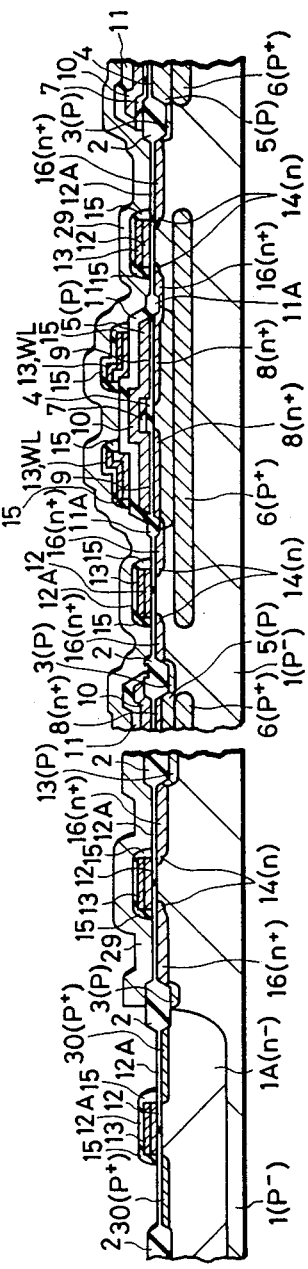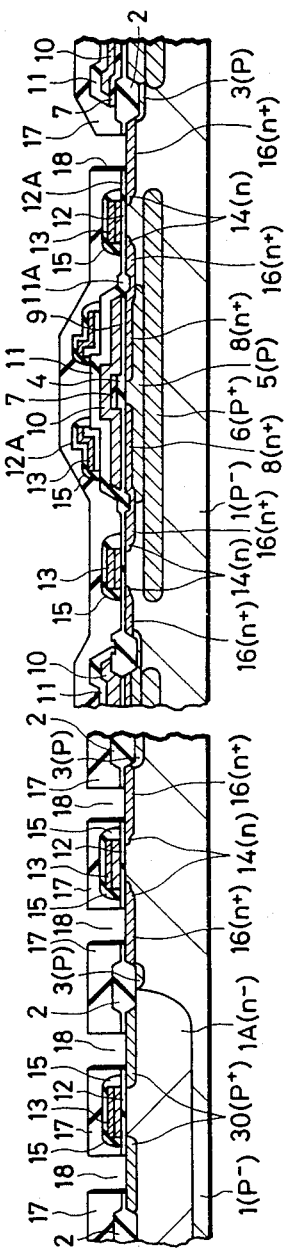

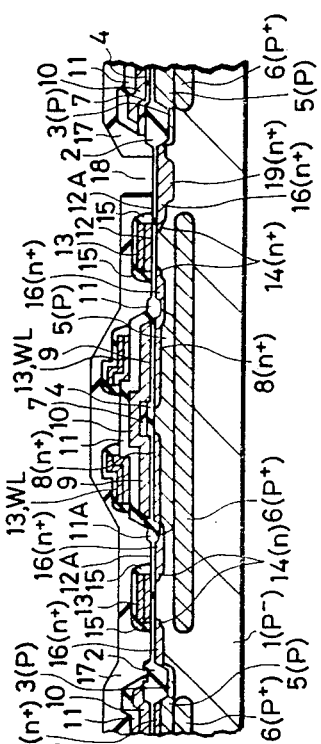
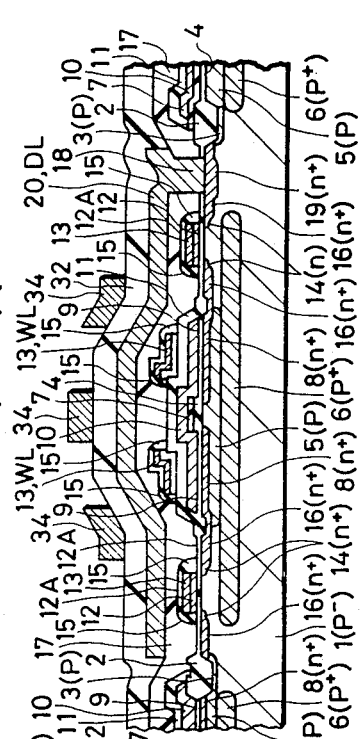
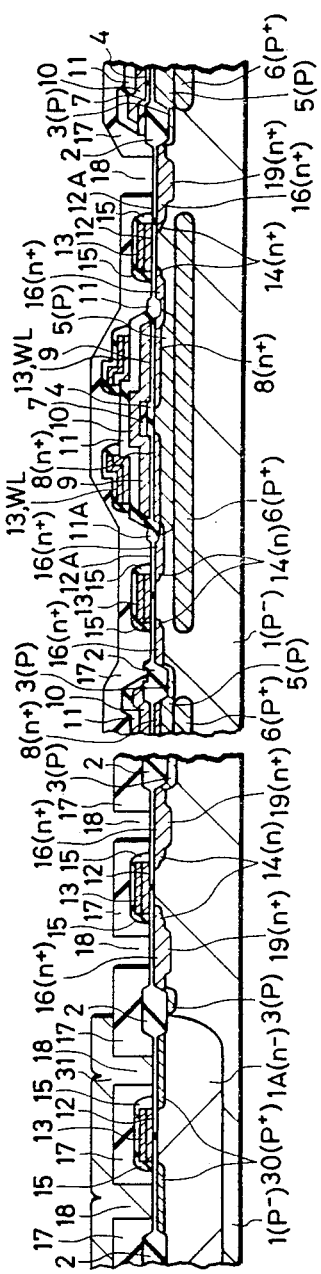
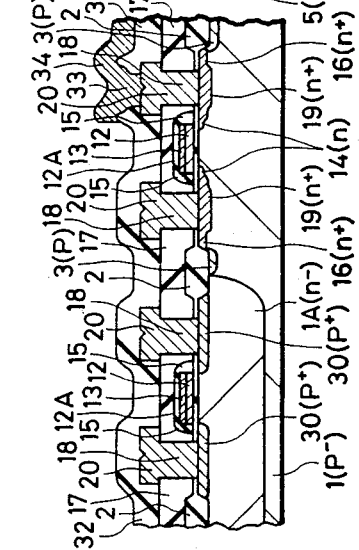
FIG. 29B   FIG. 29A
FIG. 30B   FIG. 30A

SEMICONDUCTOR MEMORY DEVICE AND A PROCESS FOR PRODUCING THE SAME

This application is a continuation application of application Ser. No. 855,418 filed Apr. 24, 1986 abandoned.

BACKGROUND OF THE INVENTION

The present invention relates to a semiconductor memory device, and particularly to technology that can be effectively adapted to a semiconductor memory device having memory cells comprised of series circuits of switching elements and data-storing capacitor elements A semiconductor integrated circuit device (hereinafter referred to as DRAM) equipped with a dynamic random access memory has been used as a semiconductor integrated circuit device having a memory function capable of rewriting the data. A memory cell of one bit of DRAM is simply constituted by a series circuit of an element for switching (selecting memory cell) and an capacitor element for storing the data This makes it possible to reduce the areas occupied by the memory cells and to increase the storing capacity As the degree of integration increases, however, it becomes difficult to maintain sufficient areas for the memory cells and, particularly, to maintain sufficient areas for the capacitors. As can be appreciated, decrease in the area for the capacitors results in a decrease of the amount of stored electric charge that serves as data. This decreased amount of stored electric charge becomes a cause of erroneous operation at the time of reading the data, and of soft errors that stem from o particles. In order to increase the amount of electric charge that serves as data and that is to be stored, attempts have been made to employ technology to constitute capacitors by utilizing moats or trenches that help increase means for storing the charge (e.g., Japanese Patent Publication No. 12739/1983). The inventors, however, have discovered a problem that the existing photolithography is not capable of forming the moats or trenches maintaining a uniform shape or depth, thus making it difficult to mass-produce DRAM's in a highly integrated form.

Further, the memory cells must be electrically isolated from a plurality of neighboring memory cells in a memory cell array. The memory cells are isolated by a field insulating film that is formed by oxidizing a semiconductor substrate using an oxidation impermeable mask. With this isolation technique, the semiconductor substrate under the oxidation impermeable mask is also oxidized to some extent, so that the difference increases between the size of the oxidation impermeable mask and the size of the field insulating film. That is, the area of the field insulating film increases while the areas of the memory cells decrease, and particularly the areas of the capacitors decrease. It was thus found that the storage of electric charge that serves as data decreases, the device erroneously operates at the time of reading the data, and soft error develops due to α particles, making it difficult to form the DRAM in a highly integrated form or to have an increased storage of electric charge.

A technique for preventing error in the amount of dimensional conversion in the above-mentioned isolation technique has been disclosed, for example, in Japanese Patent Laid-Open No. 188866/1982.

SUMMARY OF THE INVENTION

The object of the present invention is to provide a technique that is capable of forming a semiconductor memory device in a highly integrated form having an increased capacitance, e.g., an increased charge storage capacity for each memory cell.

Another object of the present invention is to provide a technique that is capable of forming a semiconductor memory device in a highly integrated form having an increased capacitance, e.g., an increased charge storage capacity for each memory cell, and capable of maintaining improved reliability, particularly by preventing minority carriers from penetrating a substrate semiconductor region constituting one electrode of the capacitor of the memory cells of the memory device.

A further object of the present invention is to provide a technique that is capable of forming a semiconductor memory device in a highly integrated form having an increased capacitance, which device can be produced through a reduced number of manufacturing steps.

A still further object of the present invention is to provide a technique that is capable of forming a semiconductor emory device in a highly integrated form having large capacitance and capable of maintaining improved reliability during the manufacturing steps.

The above and other objects as well as novel features of the present invention will become obvious from the description of the specification and the accompanying drawings.

A representative example of the invention disclosed in this application is briefly described below. However, the present invention is not limited to this example.

In a DRAM having memory cells comprised of series circuits of switching elements and data-storing capacitor elements, a first insulation film is so deposited as to define a portion of the shape of the capacitor elements, and a second insulating film that is to be used as a dielectric film is formed on the region for forming capacitor elements by using the first insulating film as a mask. One electrode of the capacitor element is formed by introducing impurities by using the first insulating film as a portion of a mask. At least one semiconductor region of an opposite type of conductivity is formed between and under the above-mentioned one electrode The shape of the memory cell is defined by the first insulating film and by an oxide film formed by thermal oxidation using an anti-oxidation film as a mask.

BRIEF DESCRIPTION OF THE DRAWINGS

FIGS. 13A to 20A, 21-23, and 24A–29A are section views illustrating major portions of the memory cell array of the DRAM of FIG. 1 in each of various manufacturing steps;

FIGS. 13B to 20B and 24B to 29B are section views illustrating major portions of MISFET's of the complementary type which constitute a peripheral circuit for the DRAM of FIG. 1 in each of various manufacturing steps;

FIGS. 30A and 30B are section views illustrating a modified example of the first embodiment;

DESCRIPTION OF THE PREFERRED EMBODIMENTS

Figure 1:
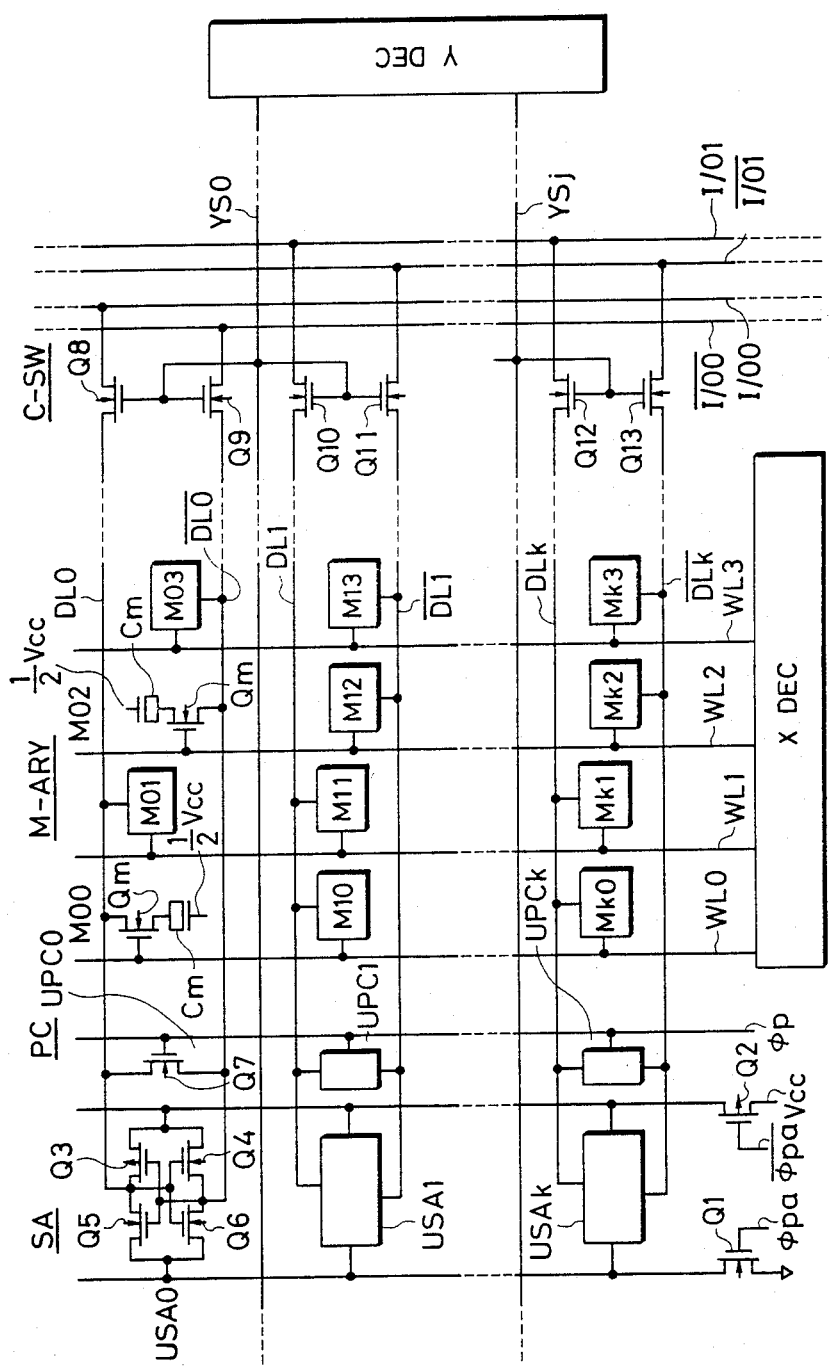
FIG. 1 is a circuit diagram illustrating major portions of a memory cell array of a DRAM according to a first embodiment of the present invention.

The present invention will be described below with reference to an embodiment of a DRAM which employs a folded bit line system. In the drawings of the embodiment, those having the same functions are denoted by the same reference numerals, and their descriptions are not repeated.

Figure 2:
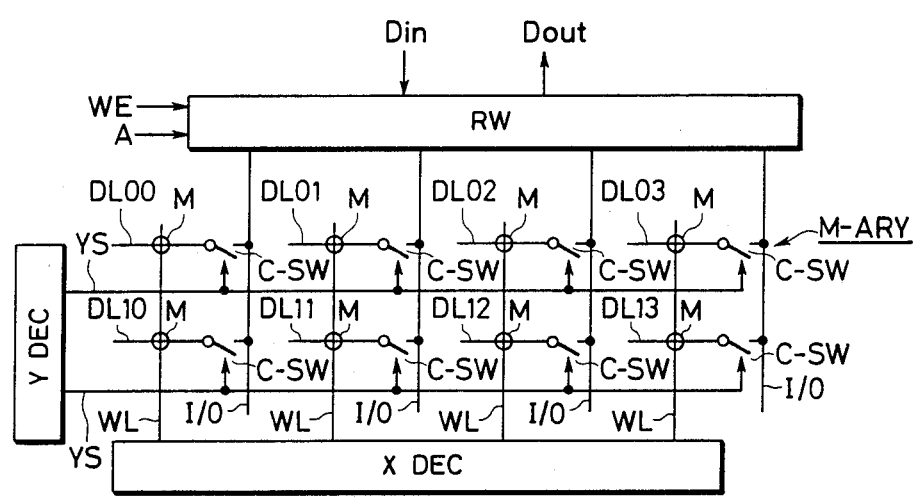
FIG. 2 is a diagram for explaining column select lines in the DRAM of FIG. 1.

FIGS. 1 and 2 are diagrams of equivalent circuits showing major portions of a memory cell array of the DRAM according to a first embodiment of the present invention.

As shown in FIG. 1, a memory array M-ARY has a plurality of pairs of data lines DL0, $\overline{DL0}$ to DLk, $\overline{DLk}$, a plurality of word lines WL0 to WL3, and a plurality of memory cells M00 to Mk3. A pair of data lines D1 extend in the direction of rows starting from an end of a sense amplifier SA. The word lines WL extend in the direction of columns to intersect the data lines DL, starting from an X-decoder XDEC. Each memory cell comprises of a switching MISFET (metal insulated semiconductor field effect transistor) Qm and an MIS capacitor Cm connected in series therewith. A fixed potential $\frac{1}{2}V_{CC}$ (a voltage one-half the power source voltage) is applied to one electrode of the capacitor Cm. The sense amplifier SA is composed of unit circuits USA0 to USAk that correspond to each of the data line pairs, and power switching MISFET's Q1 and Q2. Each unit circuit is composed of a CMOS (CMIS) latch circuit having common input and output, which is made up of p-channel MISFET's Q3, Q4 and n-channel MISFET's Q5, Q6. A precharge circuit PC is composed of a plurality of unit circuits UPC0 to UPCk, each unit circuit being comprised of an equalizer MISFET Q7 connected between the pair of data lines. A column switching circuit C-SW is composed of switching MISFET's Q8 to Q13 that will be switched by column select lines YS0 to YSj. The column select line YS extends in the same direction as the data lines DL, and is provided in a number of one for two pairs of data lines. The column select line YS is controlled by a Y-decoder YDEC. The data lines DL are selectively connected to the input/output lines I/O0 to I/O1 by the column switching circuit C-SW.

In this embodiment, though there is no particular limitation, the data line DL of the same row is divided into a plurality of lines. That is, as shown in FIG. 2, the data lines DL03 to $\overline{DL03}$ are formed by dividing a single data line DL0.

Common input/output lines I/0 are connected to a read/write circuit RW which is controlled by an address signal A and a write/read control signal WE, and which is so constituted as to write the input signal Din as data onto a memory cell M or to read the data written onto the memory cell M as a data output signal Dout.

The data lines DL are connected to the common input/output lines I/O through the column switching circuit C-SW that is controlled by control signal lines (Y-select lines) YS. In FIG. 1, the precharge circuit PC and the sense amplifier SA are provided for each of the data lines that are formed being divided.

In the memory cell array M-ARY, the arrangement of FIG. 2 is repeated in the direction of word lines.

The DRAM having such column select lines YS have been disclosed, for example, in Japanese Patent Laid-Open No. 198592/1982.

With the thus constructed DRAM in which the data lines DL are finely formed, data line capacity can be reduced, and the data can be written and read out at an increased speed. Furthermore, a high signal-to-noise ratio can be accomplished since the probability of noise that generates on the data line DL decreases with respect to data of a data line DL. Moreover, the Y-decoder YDEC which is commonly provided for the divided data lines DL helps reduce the area required for the Y-decoder YDEC, and makes it possible to increase the degree of integration.

The thus constructed circuit operates as described below.

First, when the memory has not been accessed, timing signals $\overline{\phi_{pa}}$ and $\phi_{pa}$ for controlling the operation of sense amplifier SA are the low level and the high level, respectively, and a timing signal $\phi_p$ for controlling the operation of the precharge circuit is the high level. Therefore, the sense amplifier SA is placed in an inoperative condition since the power switching MISFET's Q1 and Q2 are rendered nonconductive. As the precharge circuit PC is rendered operative by the timing signal $\phi_p$, each of the data line pairs are placed in a precharge level which is nearly equal to one-half the power source voltage $V_{CC}$. When the memory has not been accessed, furthermore, the word lines WL0 to WL3 set the non-select level, i.e., the low level.

When the memory is accessed, the timing signal $\phi_p$, first, falls to the low level in synchronism therewith, so that the precharge circuit PC is rendered inoperative. After the precharge circuit PC is rendered inoperative, the x-address decoder XDEC is rendered operative. Responsive thereto, any one of the word lines WL0 to WL3 change to the select level. As the word line is selected, the data of a memory cell is given to a corresponding data line. For instance, when the word line WL0 is selected, the data of memory cells M00, M10 and MK0 are given to lines of one side of the complementary data lines DL0, DL1 and DLk. The potential of lines of the other side of the complementary data lines is maintained at the precharge level of $\frac{1}{2}V_{CC}$, and is supplied to the sense amplifier SA as a reference voltage.

After the word line is selected the timing signals $\phi_{pa}$ and $\overline{\phi_{pa}}$ take the high level and the low level, respectively. This enables the sense amplifier SA to start the operation, whereby the data signals given from the memory cells to the data lines are amplified.

The column select lines YS0 to YSj are made the low level, i.e., the non-select level. The Y-address decoder YDEC starts to operate at a suitable timing after the X-decoder XDEC is operated. Accordingly, any one of the column select lines YS0 to YSj change to the high level, i.e., the select level, and the column switch MOSFET is rendered conductive. That is, in the memory array M-ARY, two sets of complementary data lines among a plurality of complementary data lines are coupled to common complementary data lines I/00 and $\overline{I/01}$ via the column switching circuit C-SW.

Here, the precharge level ½ $V_{CC}$ is obtained by short-circuiting the complementary data lines which the potentials $V_{CC}$ and $V_{SS}$ as a result of reading the data at the previous timing.

Figure 3:
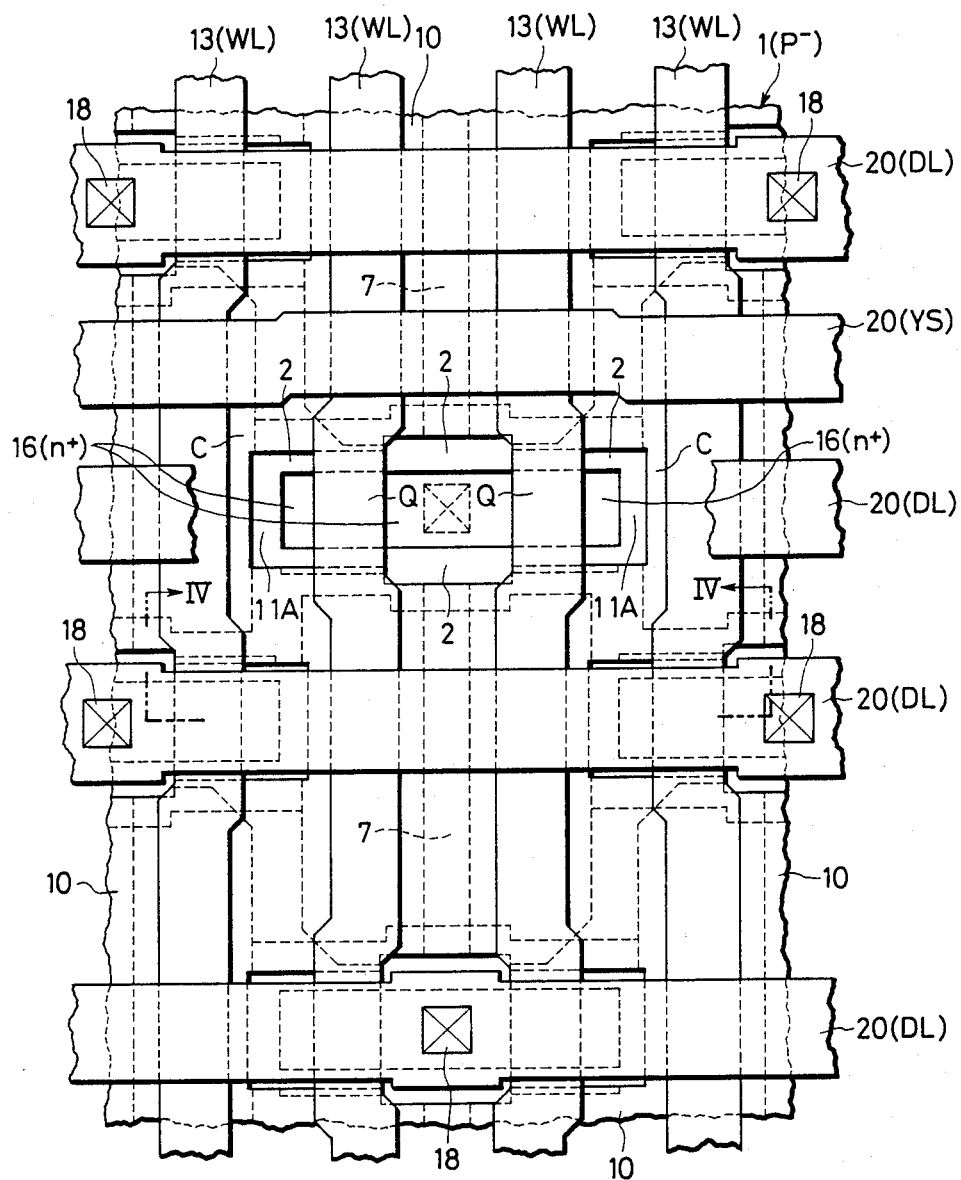
FIG. 3 is a plan view showing a memory array of the DRAM of FIG. 1.
Figure 4:
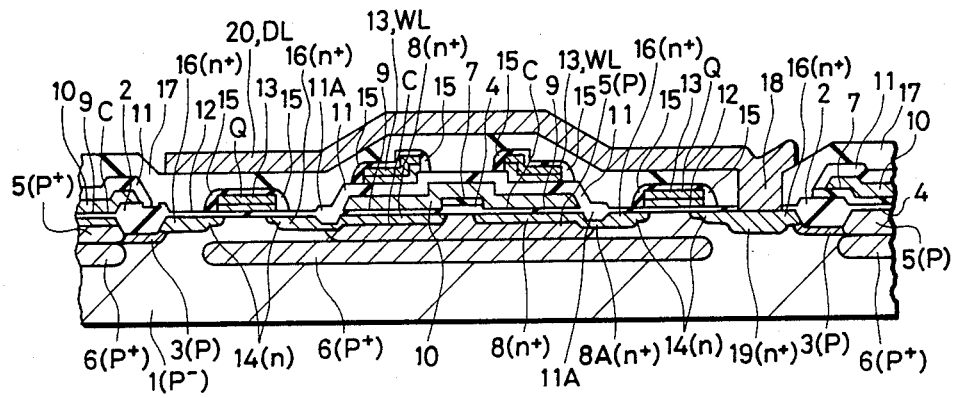
FIG. 4 is a section view along the line IV—IV of FIG. 3.

FIG. 3 is a plan view showing major portions in the memory cell array of a DRAM to explain the structure of the first embodiment of the present invention; FIG. 4 is a section view along the line IV—IV of FIG. 3; and FIG. 5 is a diagram showing the distribution of impurity concentration in the capacitor portion for storing data of FIG. 3.

In FIG. 3 and the subsequent plan views, with the exception of the field insulating film, the insulating films provided between the conductive layers are not shown, for the purpose of easy understanding of the structure of the embodiment.

Figure 5:
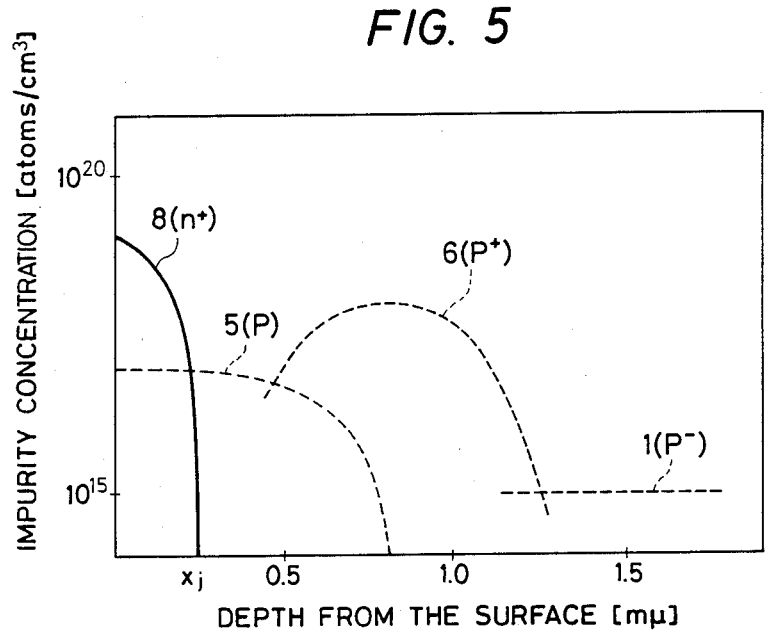
FIG. 5 is a diagram showing the distribution of impurity concentration in the capacitor portion of FIG. 3.
Figure 6:
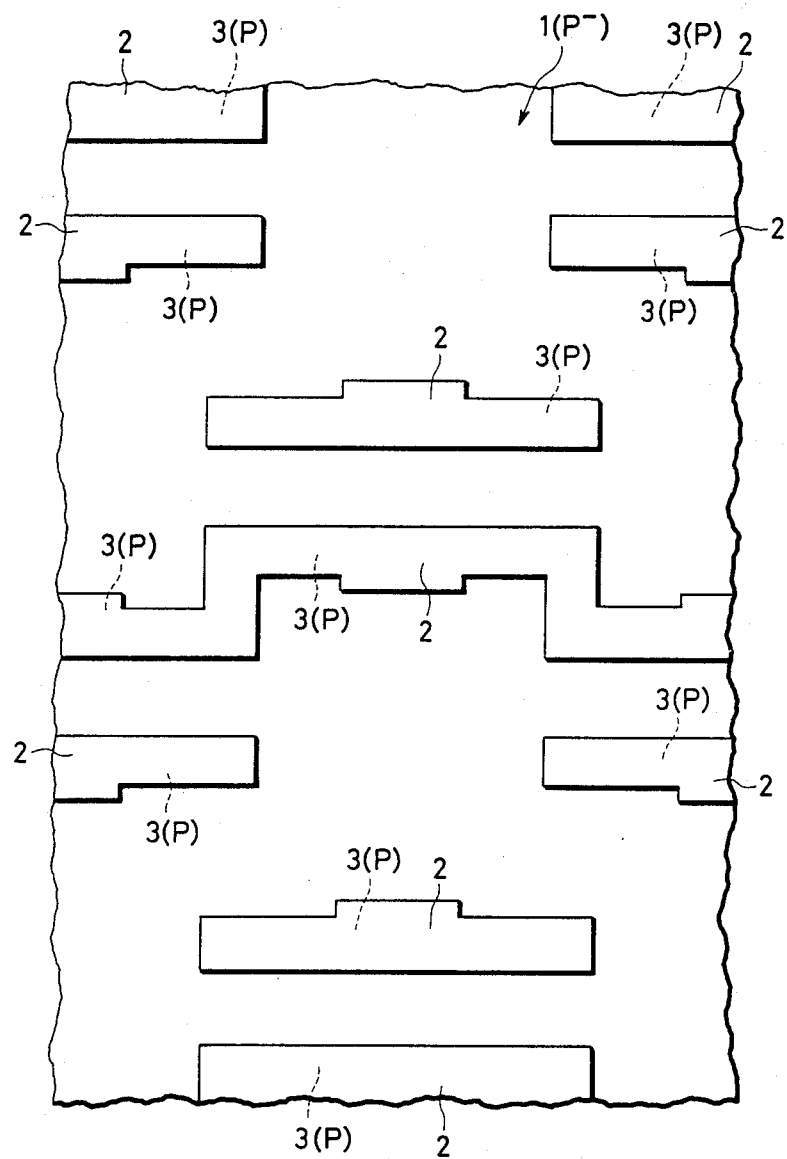
FIGS. 6 to 12 are plan views illustrating major portions of the memory cell array of the DRAM of FIG. 1 in each of various manufacturing steps.

In FIGS. 3 to 5, reference numeral 1 denotes a $p^-$-type semiconductor substrate made of single crystalline silicon which constitutes a DRAM. The semiconductor substrate 1 contains p-type impurities (boron ions) at a concentration of, for example, about $1 \times 10^{15}$ atoms cm$^3$ and is designated at 1 in FIG. 5. Peripheral circuits other than the memory cell array, such as sense amplifier SA, address select circuit, read circuit and write circuit are constituted by complementary MISFET's. Therefore, an $n^-$-type well region (or an $n^-$-type well region and a $p^-$-type well region) are formed in the main surface of the semiconductor substrate 1.

Reference numeral 2 denotes a field insulating film (insulating film for isolating elements) which is formed on the main surface of the semiconductor substrate 1 to define a portion of the shape of the switching MISFET and, particularly, to define the gate width (channel width). The field insulating film 2 is constituted by an insulating film which is formed by, e.g., thermally oxidizing the semiconductor substrate (or the well region) 1, and works chiefly to electrically isolate the semiconductor elements. The field insulating film 2 produces a large error in the amount of dimensional conversion but does not hinder the device from being highly integrated or from having an increased capacity, except for the capacitors.

The DRAM is so constituted that the memory cells are repetitively arranged in the direction in which the bit lines that will be described later extend, and that the switching MISFET and the data-storing capacitor of the neighboring cell are repetitively arranged in the direction in which the word lines that will be described later extend. Therefore, the field insulating films 2 define the gate width of the switching MISFET, and also define a predetermined shape of the data-storing capacitor of the neighboring memory cell. That is, in the memory cell array, the field insulating films 2 work to electrically isolate the switching MISFET from the data-storing capacitor of a neighboring memory cell. Furthermore, the field insulating films 2 which define the gate width of the switching MISFET Q are arranged maintaining nearly the same pitch in the direction in which the data lines extend. The field insulating films are further arranged maintaining two different pitches in the direction in which the word lines that will be described later extend. This is to provide margin in the pitch among the data lines for every predetermined pitch. That is, it is permitted to extend the conductive layers that are the same layer as the data lines but that have other functions. The field insulating film 2 is also used as a mask for introducing impurities in order to form a source region or a drain region of a switching MISFET or to form a semiconductor region of a data-storing capacitor. Further, the field insulating film 2 works not only to electrically isolate predetermined memory cells from one another but also to electrically isolate therefrom semiconductor elements that constitute a peripheral circuit and the like. The field insulating films 2 for electrically isolating the memory cells and for electrically isolating the semiconductor elements that constitute the peripheral circuits are formed through the same manufacturing step.

Reference numeral 3 denotes a p-type channel stopper which is provided under a predetermined field insulating film 2. The channel stopper region 3 restrains a parasitic channel from forming in the main surface of the semiconductor substrate under the field insulating film 2, and also electrically isolates semiconductor elements from one another. The channel stopper region 3 has an impurity concentration of, for example, about $1 \times 10^{16}$ atoms cm$^3$.

Reference numeral 4 denotes an insulating film which is chiefly formed among the data-storing capacitors or, in other words, which is formed on the main surface of the semiconductor substrate 1 to define a portion of the shape of data-storing capacitors. The insulating film 4 chiefly works to electrically isolate the data-storing capacitors, and to form a mask for introducing impurities during the manufacturing steps.

The insulating film 4 is made of a silicon oxide film which is formed by the technique of thermal oxidation to oxidize the semiconductor substrate 1, by the technique of chemical vapor deposition (CVD) or by the technique of plasma CVD.

As will be described later, the insulating film 4 is patterned in a self-aligned manner relative to an insulating film 7 which will be formed thereon, and minimizes the error in the amount of dimensional conversion between the mask size and the pattern size This helps restrain the areas of the capacitor-forming regions from being reduced. The insulating film 4 reduces the stress that stems from the difference of thermal expansion between the semiconductor substrate 1 and the insulating film 7 formed on the insulating film 4. The insulating film 4 has a thickness greater than that of the insulating film 9 which forms part of the capacitors. This helps increase the threshold voltage of parasitic MISFET's formed among the data-storing capacitors and increase electric isolation function Reference numeral 5 denotes a p-type semiconductor region formed in the capacitor-forming region and in the main surface of the semiconductor substrate 1 among the capacitor elements C in the directions of rows and columns. The semiconductor region 5 among the capacitors C works to increase the threshold voltage of parasitic MISFET's, to restrain the generation of parasitic channels, and to electrically isolate the data-storing capacitors from one another. The semiconductor region 5 on the capacitor-forming region chiefly works to form an electrode of the capacitors. The semiconductor region 5 should have an impurity concentration of about $1 \times 10^{17}$ atoms/cm$^3$, as shown at 5 in FIG. 5, and should have a depth of about 0.7 μm. The impurity concentration of the semiconductor region 5 is determined by a pn junction breakdown voltage (for example, a voltage of about 10 to 14 V is necessary) relative to an n$^+$-type semiconductor region 8 which constitutes one electrode of the capacitor, and electric isolation breakdown voltage among the capacitors. The semiconductor region 5 works to restrain a depletion region from stretching, that is formed on the side of the semiconductor region 5 starting from the pn junction relative to the n$^+$-type semiconductor region which constitutes one electrode of the capacitor. This makes it possible to reduce the probability for trapping minority carriers that generate in the semiconductor substrate 1 due to α particles, and to restrain the development of soft error. The semiconductor region 5 has an impurity concentration which is higher than that of the channel stopper region 3.

Figure 42:
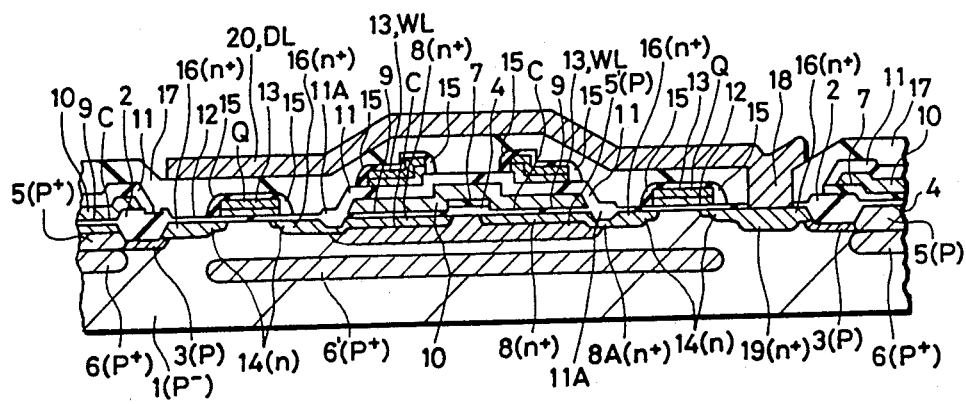
FIG. 42 is a section view corresponding to FIG. 4, but showing structure wherein the second and third semiconductor regions are spaced from each other.

Reference numeral 6 denotes a p$^+$-type semiconductor region formed in the main surface of the semiconductor substrate 1 under the semiconductor region 5 of the capacitor-forming region. The semiconductor region 6 has an area which is equal to, or larger than, that of the semiconductor region 5. The semiconductor region 6 works to restrain the depletion region from stretching, that is formed on the side of the semiconductor region 5, starting from the pn junction between the semiconductor region 5 and the n$^+$-type semiconductor region 8 which constitutes an electrode of the capacitor. Further, the semiconductor region 6 has an impurity concentration higher than that of the semiconductor substrate 1, and constitutes a potential barrier relative to the minority carriers. That is, the semiconductor region 6 reduces the probability for trapping minority carriers that generate in the semiconductor substrate due to o particles, restrains minority carriers from entering into the capacitors, and hence prevents the occurrence of soft error. The semiconductor region 6 has an impurity concentration equal to, or higher than, that of the semiconductor region 5, and is formed being connected to, or suitably separated away from (e.g., spaced by a distance in the range of 0.1-0.2 micron), the semiconductor region 5. Structure wherein the two semiconductor regions are separated can be seen in FIG. 42, where semiconductor region 5' is spaced from semiconductor region 6'. The semiconductor region 6 should have an impurity concentration of, for example, about $1 \times 10^{17}$ to $1 \times 10^{18}$ atoms/cm$^3$ as shown by 6 in FIG. 5, and should have a maximum impurity concentration at a depth of about 1.2 μm. The semiconductor region 6 and the semiconductor region 5 are independently formed through separate manufacturing steps so as to have optimum distributions of impurity concentrations, respectively. The semiconductor region 6 is provided under the region which is one of the source or drain regions of the switching MISFET and which is electrically connected to the data-storing capacitor. That is, the semiconductor region 6 works to restrain the infiltration of minority carriers from the source region or the drain region, and to prevent the occurrence of soft error. The semiconductor region 6 is not provided under the region which is the other of the source or drain region of the switching MISFET and which is electrically connected to the data line. This makes it possible to reduce the parasitic capacity added to the source region or the drain region, i.e., to reduce the parasitic capacity added to the data lines, and hence to increase the speed of data reading operation of the DRAM.

Reference numeral 7 denotes an insulating film which is provided among the capacitors in the directions of rows and columns or, in other words, which is provided on the insulating film 4 so as to define a portion of the shape of the capacitors. The insulating film 7 works to electrically isolate the capacitors from one another, or works as a mask for introducing impurities, or as an oxidation impermeable mask or a mask for etching. The insulating film 7 is deposited by the CVD technique, plasma CVD technique or a like technique, and is composed of, for example, a silicon nitride film to exhibit resistance against the oxidation. Compared with an insulating film which is formed by thermally oxidizing the semiconductor substrate 1, the insulating film 7 which is deposited minimizes the dimensional conversion between the size of mask and the side of pattern. Therefore, the area of the capacitor-forming region is restrained from being reduced.

In this embodiment, the insulating film 4 and the insulating film 7 constitute an insulating film for isolation to define the shape of the capacitors and to electrically isolate neighboring capacitors. When the insulating film for isolation is constituted by the insulating film 7 which is made of a silicon nitride film, it becomes necessary to use the insulating film 4 composed of the silicon oxide film in order to reduce the stress that results from the difference in the thermal expansion relative to the semiconductor substrate 1. However, if the stress need not be reduced, the insulating film for isolation may be composed of the insulating film 7. Further, if the number of manufacturing steps for forming such masks as oxidation impermeable mask and etching mask need not be reduced, the insulating film for isolation may be composed of the insulating film 4.

The shape of memory cells of the DRAM is defined by the field insulating film 2 which defines the gate width of the switching MISFET and which defines the width of the capacitor of a portion neighboring the switching MISFET, and is further defined by the insulating film (insulating films 4, 7) for isolation which defines a distance among the capacitors in the directions of rows and columns.

Memory cells have a shape midway between a T-shape and an L-shape, and, e.g., oblong capacitors are asymmetrically arranged relative to the switching MISFET's (or data lines). Th-si is to provide a margin for the pitch of the data lines and to restrain the areas of capacitors from being reduced by the field insulating film 2.

The capacitor C of a memory cell of which the shape is thus defined is chiefly comprised of a first capacitor which comprises a semiconductor region 8, an insulating film 9 and an electrically conductive plate 10. A second capacitor comprised of a semiconductor region 5 and the semiconductor region 8 is further added thereto to increase the capacity. That is, since the first capacitor and the second capacitor are stacked in a three dimensional manner, the data-storing capacitor C of this embodiment can store an increased amount of electric charge which serves as data, while enabling the area of the semiconductor substrate 1 to be reduced.

The n+-type semiconductor region 8 is provided so as to extend to the main surface of the capacitor-forming region, and constitutes one electrode of the capacitor C As designated at in FIG. 5, the semiconductor region 8 has an impurity concentration of about $1 \times 10^{19}$ atoms/cm$^3$ and a junction depth $x_j$ of about 0.20 to 0.25 μm, in order to increase capacity of the pn junction between the semiconductor region 5 and 8. The semiconductor region 8 is formed in a self-aligned manner with the field insulating film 2 and the insulating film 7.

The insulating film 9 is provided chiefly over the semiconductor region 5 and constitutes a dielectric film of the capacitor. In order to increase the capacity of the data-storing capacitor, the insulating film 9 has a thickness which is smaller than that of the insulating film 4.

The electrically conductive layer 10 is provided on the insulating film 9 of the capacitor-forming region, and on the insulating film 7 among the capacitors, and constitutes another electrode of the capacitor. The conductive layer 10 is constituted through a step of forming a first conductive layer. The conductive layer 10 is formed by, for instance, the CVD technique and is comprised of a polycrystalline silicon film which contains impurities. The conductive layer 10 need not be limited to the polycrystalline silicon film but may be comprised of a conductive layer of any other kind The capacitor C stores the data of "1" or "0" when a voltage $V_{SS}$ (e.g., zero volt) or the voltage $V_{CC}$ is applied to the semiconductor region 8, while a voltage $\frac{1}{2}V_{CC}$ (e.g., $-2.5$ volts) is applied to the conductive layer 10. The voltage applied to region 5, acting as an electrode of the second capacitor, is $V_{BB}$ (the substrate back bias voltage, e.g., $-3.0$ V). The voltage $V_{BB}$ is applied to the semiconductor region 5 through substrate 1 (in this regard, substrate 1 and regions 5 and 6 are at the same potential). The second capacitor (comprised of regions 5 and 8) adds somewhat to the total capacitance of each memory cell, the primary purpose of region 5 being for preventing minority carriers from penetrating region 8. This makes it possible to reduce the intensity of electric field between the semiconductor region 8 and the conductive layer 10 and, hence, to reduce the thickness of the insulating film 9. Since the voltage applied to the conductive layer 10 is as small as $\frac{1}{2}V_{CC}$, the threshold voltage of a parasitic MOSFET between the neighboring memory cells (particularly, between the neighboring capacitors) can be reduced to a relatively small value. Therefore, the impurity concentration of the semiconductor region 5 can be set to the above-mentioned value. Accordingly, the breakdown voltage of pn junction between the region 5 and the region 8 is set to a high value, and the memory cells can be reliably isolated from one another.

Reference numeral 11 denotes an insulating film which is so provided as to cover the conductive layer 10. The insulating film 11 works to electrically isolate the conductive layer 1 from an electrically conductive layer that is formed thereon.

Reference numeral 11A denotes an insulating film formed on the main surface of the semiconductor region of a portion where the capacitor C and the switching MISFET are connected together.

The switching MISFET Q of the DRAM is composed chiefly of semiconductor substrate 1, insulating film 12, conductive layer 13, a pair of semiconductor regions 14 and a pair of semiconductor regions 16, and has an LDD (lightly doped drain) structure, as known in the art.

The insulating film 12 is provided on the main surface of the semiconductor substrate 1 of the switching MISFET-forming region, and forms a gate insulating film for the MISFET.

The conductive layer 13 is formed on a predetermined portion of the insulating film 12 and on a predetermined portion of the insulating film 11. The conductive layer 13 on the switching MISFET-forming region constitutes a gate electrode for the MISFET. The conductive layer 13 on other regions is formed together with the gate electrode of other MISFET's, and constitutes the word line WL. The conductive layer 13 is formed through a step of forming a second conductive layer (second level of conductor). In order to increase the speed for writing and reading the data, the conductive layer 13 is composed of a stacked film obtained by depositing a tungsten silicide (WSi$_2$) film on a polycrystalline silicon film which contains impurities to reduce the resistance, as is known in the art. The conductive layer 13 may further be comprised of a polycrystalline silicon film, a refractory (high-melting) metal (Mo, Ta, Ti, W) film, a stacked film (MoSi$_2$, TaSi$_2$, TiSi$_2$ on polycrystalline silicon) other than the above-mentioned stacked film, or a silicide (MoSi$_2$, TaSi$_2$, TiSi$_2$, WSi$_2$) film.

The n-type semiconductor regions 14 are provided on the main surface of the semiconductor substrate 1 on both sides of the conductive layer 13 of the switching MISFET-forming region. The semiconductor regions 14 reduce the intensity of the electric field near the drain region of the switching MISFET, and restrains the change of threshold voltage Vth with the lapse of time that will be caused by hot carriers The semiconductor regions 14 constitute the so-called LDD structure. The semiconductor regions 14 have an impurity concentration of, for example, about $1 \times 10^{18}$ atoms/cm$^3$ and a junction depth of about 0.2 μm. The semiconductor regions 14 are formed being self-aligned with the conductive layer 13.

Side wall spacers 15 are provided on the insulating films 1, 12 on both sides of the conductive layer 13, being formed by techniques (e.g., reactive ion etching) known in the art, and work to form the LDD structure The side walls 15 are formed being self-aligned with the conductive layer 13.

The n+-type semiconductor regions 16 are provided extending to the main surface of the semiconductor substrate 1 of the switching MISFET-forming region, and are electrically connected to the semiconductor regions 14 and to the semiconductor region 8. The semiconductor regions 16 substantially constitute a source region or a drain region of the switching MISFET The semiconductor regions 16 have an impurity concentration of, for example, about $1 \times 10^{20}$ atoms cm$^3$ and a junction depth of about 0.3 μm. The semiconductor regions 16 are formed being self-aligned with the conductive layer 13, the mask 15 for introducing impurities and the field insulating film 2.

The insulating film 17 covers the transistor Q, the capacitor C and the conductive layer 13 The insulating film 17 electrically isolates the conductive layer 13 and the semiconductor regions 16 from the conductive layers that are formed thereon.

Reference numeral 18 denotes a connection (contact) hole which is formed by removing the insulating films 12, 17 at a predetermined location on the semiconductor region 16. The connection hole 18 is to electrically connect the semiconductor region 16 and the data line together The n+-type semiconductor region 19, having a junction which is deeper than that of other junctions, is provided under the connection hole 18. The semiconductor region 19 is formed to prevent the pn junction between the semiconductor substrate 1 and the semiconductor region 16 from being damaged by an alloy of semiconductor region (silicon) 16 and data line (such as aluminum film) 20. The semiconductor region 19 has a junction depth of, for example, about 0.5 $\mu$m.

Reference numeral 20 denotes an electrically conductive layer formed through a step of forming the third conductive layer (third level of conductor). The conductive layer 20 which constitutes a data line DL is electrically connected to the predetermined semiconductor region 16 through the connection hole 18, and extends in the direction of rows on the insulating film 17. The conductive layer 20 further constitutes a column select line YS. The data line DL and column select line YS extend in the same direction in the memory array, and can be formed by the layer of the same level. The data lines DL and Y-select lines YS, formed by the same conductive layer 20 of the same conductive material, make it possible to reduce the number of manufacturing steps With the data lines DL and the Y-select lines YS being formed by the same conductive layer 20, there develops no deviation (misregistration) in aligning the masks in the manufacturing step, unlike when these lines are constituted by different conductive layers. Therefore, no change develops in the coupling capacity among the data lines and Y-select lines, and the capacity of data lines DL is prevented from changing The Y-select line YS formed nearly at the center between the pair of data lines DL equalizes the coupling capacity therebetween; i.e., capacities of the data lines DL can be equalized Therefore, the signal-to-noise ratio can be increased.

A manufacturing process according to the first embodiment will be concretely described below with reference to steps for manufacturing memory cells and steps for manufacturing complementary MISFET's that constitute peripheral circuits.

Figure 22:
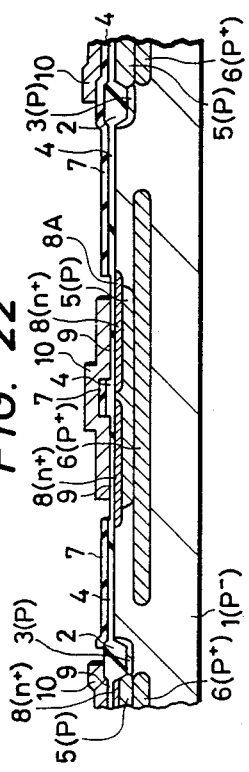
Figure 23:
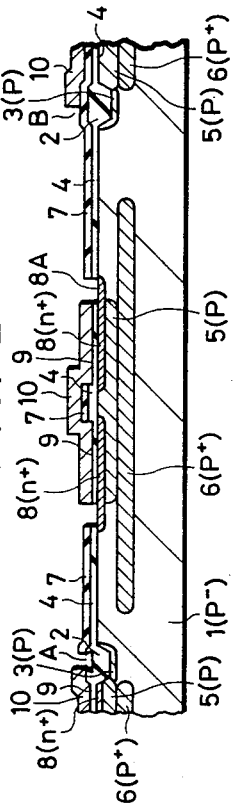

FIGS. 6 to 29B are diagrams for explaining a manufacturing process according to the first embodiment of the present invention, wherein FIGS. 6 to 12 are plan views showing major portions of the memory cell array in each of the manufacturing steps, diagrams A of FIGS. 13 to 20 and 24 to 29 as well as FIGS. 21–23, are section views which illustrate major portions of the memory cell array in each of the manufacturing steps and which correspond to FIG. 4, and diagrams B of FIGS. 13 to and 24–29 are section views which illustrate major portions of complementary MISFET's that constitute peripheral circuits in each of the manufacturing steps.

A p$^-$-type semiconductor substrate 1 made of single crystalline silicon is prepared. Such substrate can be a silicon monocrystalline body, or a silicon epitaxial layer, for example, although the semiconductor substrate 1 is not limited thereto. On the substrate 1 are successively laminated first, second and third mask-forming layers in order to form a mask for introducing impurities, an oxidation impermeable mask, and a mask for etching.

The first mask-forming layer is made of, for example, a silicon oxide film 22A that is formed by oxidizing (e.g., thermally oxidizing, by conventional procedures) the main surface of the semiconductor substrate 1, so that it can be used as a mask for introducing impurities. The second mask-forming layer is made of, for example, a silicon nitride film 22 formed by the CVD technique so that it can be used as an oxidation impermeable mask. The third mask-forming layer comprises, for example, a resist film 21 formed by the coating technique so that it can be used as a mask for etching.

The third mask-forming layer is subjected to patterning to form a mask 21 from which the portions thereof over the well-forming region is removed. Using the mask 21, the second mask-forming layer is subjected to patterning to form a mask 22.

Then, using the mask 21, impurities P for forming n-type well regions are introduced into the main surface of the semiconductor substrate 1 via the mask-forming layer 22A as shown in FIGS. 13A and 13B. The impurities P consist of phosphorus ions and are introduced by the conventional ion implantation technique, as known for forming well regions. The mask 21 is then removed.

As shown in FIGS. 14A and 14B, the first mask-forming layer 22A is oxidized using the mask 22 thereby to form a mask 23 that will be used in a step of forming the channel stopper region. Such mask 23 has an exemplary thickness of 100 nm, although such thickness is not limited thereto.

Thereafter, the impurities P are diffused to form an n$^-$-type well region 1A as shown in FIGS. 15A and 15B.

This embodiment employs a single well system provided with the n$^-$-type well region 1A. However, it is also allowable to employ a single well system in which the n-type semiconductor substrate is provided with the p-type well region. It is further allowable to employ a twin well system in which the p-type or n-type semiconductor substrate is provided with the n-type well region and the p-type well region The mask 22 is then removed.

On the main surface of the semiconductor substrate 1 is formed a field insulating film 2 which defines a portion (gate width) of the shape of the switching MISFET, which defines a portion (a portion between the switching MISFET and the capacitor) of the shape of the capacitor, and which defines the shape of the complementary MISFET's Such field insulating film, as well as a p-type channel stopper region 3 formed beneath the field insulating film, can be formed in the following manner Using the mask for forming the field insulating film 2, and the above-mentioned mask 23 (by utilizing the difference in the film thickness), a p-type channel stopper region 3 is formed in the main surface region of the semiconductor substrate 1 at the location of the field insulating film 2 The channel stopper region 3 is formed, for example, by introducing impurities (e.g., BF$_2$ ions) by the ion implantation technique, and by diffusing the impurities in the step of thermal oxidation for forming the field insulating film 2. Though not diagramed, the field insulating film 2 is 5 formed to have a thickness of for example about 500 to 600 nm by oxidizing the main surface of the semiconductor substrate 1 and the well region 1A using an oxidation impermeable mask such as silicon nitride film, formed by conventional techniques after removal of mask 22 but prior to introduction of the impurities for the channel stopper region The mask 23 and the first mask-forming layer 22A, as well as the oxidation impermeable mask such as silicon nitride film used for forming the field insulating film 2, are then removed.

Thereafter, an insulating film 4 is formed on the semiconductor substrate 1 that serves as a semiconductor element-forming region, as shown in FIGS. 16A and 16B. The insulating film 4 is made of a silicon oxide film formed by the technique of thermal oxidation and has a thickness of about 40 nm.

Figure 7:
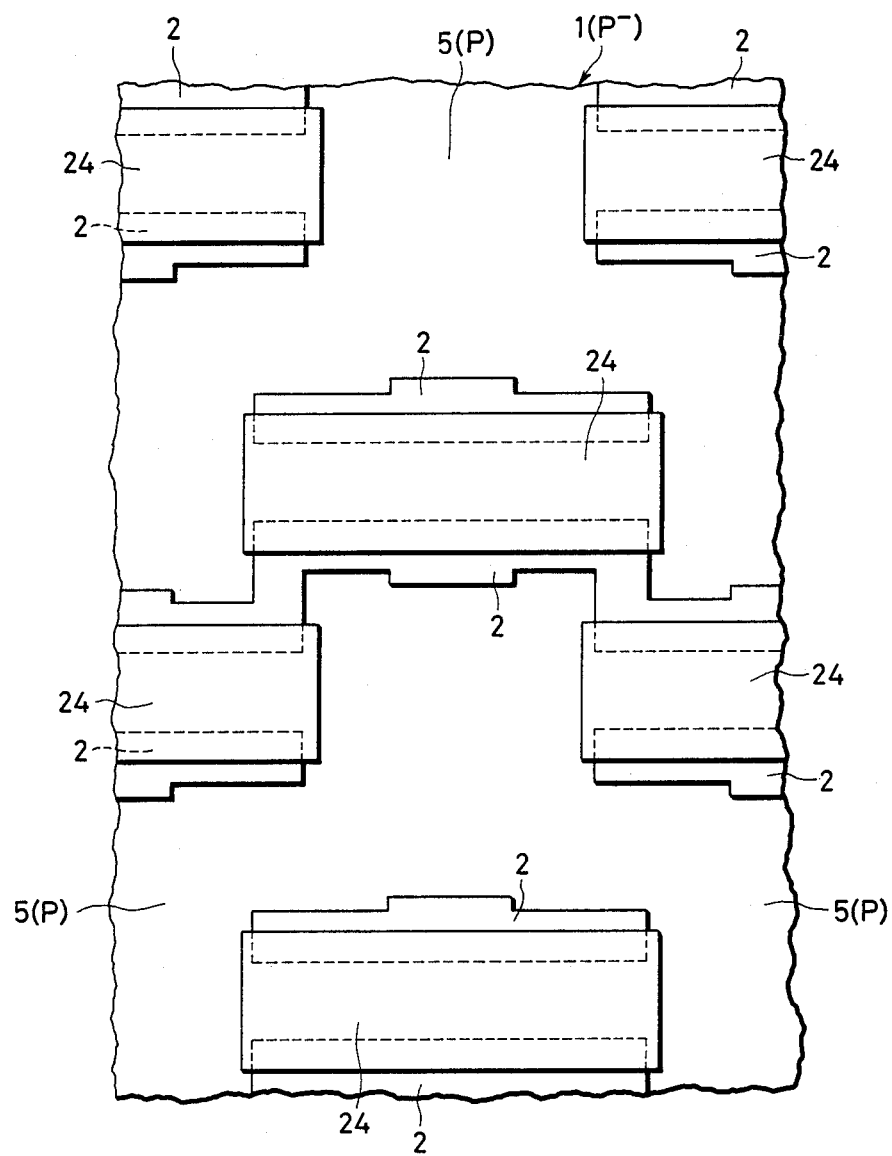

Then, as shown in FIGS. 7, 17A, 17B, a mask 24 for introducing impurities is formed on the insulating film 4 of the switching MISFET-forming region (region other than the capacitor-forming region) The mask 24 for introducing impurities comprises, for example, a photoresist film The mask 24 for introducing impurities easily develops deviation in mask-aligning with the field insulating film 2 in the manufacturing step. Deviation in aligning the mask in the direction of columns (direction in which the word lines extend) is absorbed by the dimension of width of the field insulating film 2, and the storage of charge, that serves as data, in the capacitor does not increase or decrease. Deviation in aligning the mask in the direction of rows (direction in which the data lines extend) causes the storage of charge, that serves as data, to increase or decrease. However, since deviation in aligning the mask causes the area to change very little with respect to the area of the capacitor, increase or decrease of the storage of charge that serves as data can be neglected Accordingly, the field insulating film 2 must be formed to have a width greater than the deviation of mask alignment in the manufacturing step As shown in FIGS. 7, 17A and 17B, a p-type semiconductor region 5 is formed in the main surface region of the semiconductor substrate 1 by using the mask 24 for introducing impurities and by using the field insulating film 2 in order to form a part of the capacitance of the capacitor, to form a potential barrier to reduce soft error and to form an isolation region to isolate the capacitors from one another. The semiconductor region 5 is formed by introducing impurities (B+ ions) by the ion implantation technique at a concentration of about $5 \times 10^{12}$ atoms/cm$^2$ with the energy of about 100 KeV, followed by diffusion after the mask 24 is removed. The semiconductor region 5 is formed being self-aligned with the field insulating film 2, and is separated away by a predetermined distance (e.g., generally equal to the width of the field insulating film 2, about 1.0 µm, for example, although such distance is not limited thereto) from the source region or the drain region of switching MISFET of a neighboring memory cell The semiconductor region 5 is formed extending to the surface of the substrate to isolate the capacitors C from one another. The capacitors and the isolation region therefor are formed through the same step, contributing to reduce the number of manufacturing steps.

Figure 8:
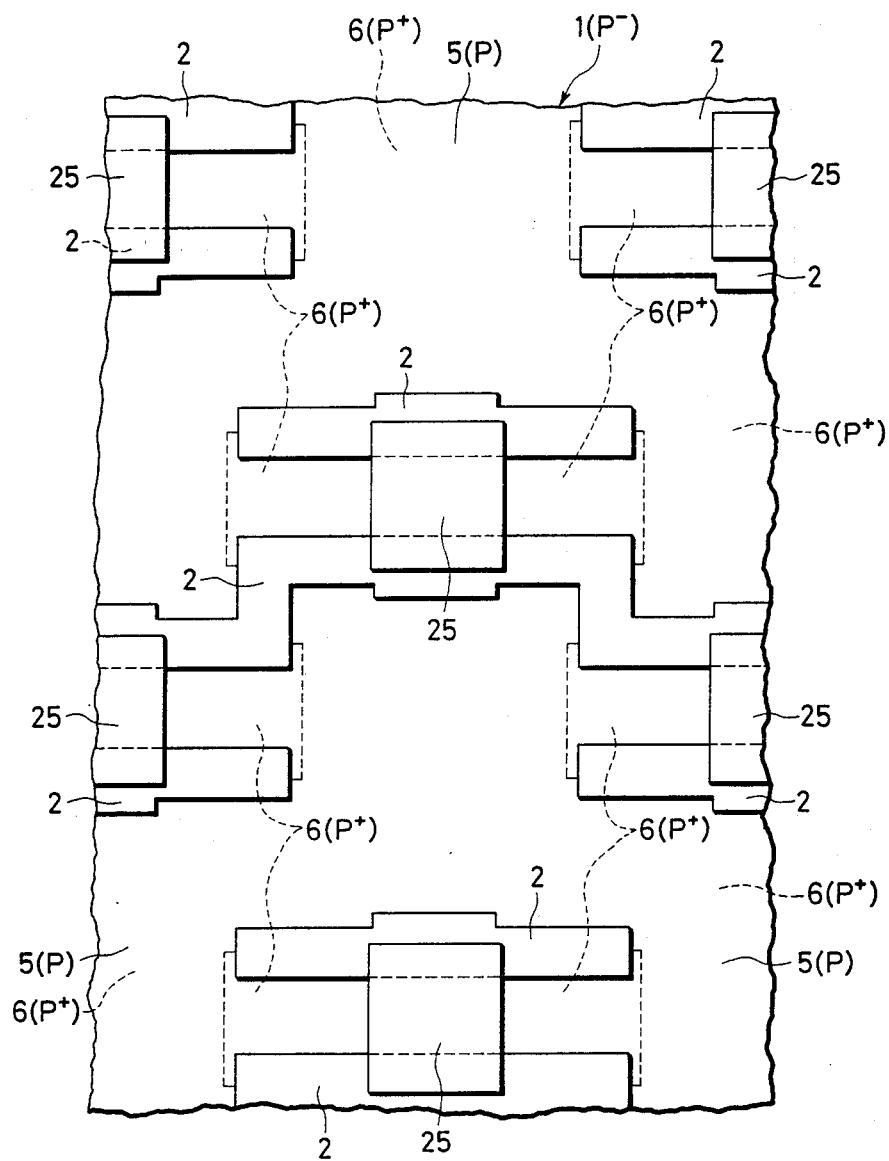

As shown in FIGS. 8, 18A and 18B, a mask 25 for introducing impurities is formed on the peripheral circuit and on the region for forming source or drain of the switching MISFET cf a portion connected to the data line. The mask 25 is made, for example, of a photoresist film. Thereafter, the p+-type semiconductor region 6 is formed in the main surface of the semiconductor substrate 1 using the mask 25 and the field insulating film 2. For instance, impurities (B++ ions) are implanted at a concentration of $1 \times 10^{13}$ atoms/cm$^2$ with the energy of about 150 KeV. After the mask 25 is removed, the impurities that are implanted are diffused to form the region 6. The semiconductor region 6 is formed to prevent minority carriers from entering into the memory cells and is, hence, formed more deeply than the region 5. Further, the region 6 which does not form pn junction has an impurity concentration which is higher than that of the region 5. Then, as shown in FIGS. 19A and 19B, photoresist masks 26 for etching and for introducing impurities, are newly formed on the switching MISFET-forming region, on the portions among the capacitors, on the predetermined field insulating film 2, and -) on the region of forming complementary MISFET's that constitutes the peripheral circuit The insulating film 7 is formed by conventional photolithography, using masks 26. The insulating film 7 defines a portion of the shape of the capacitor (works to isolate the capacitors) and exhibits resistance against oxidation. Prior to forming the mask 26 on the whole surface of the substrate, therefore, a film for forming the insulating film 7 is formed to have a thickness of about 50 nm by using a silicon nitride film formed by the plasma CVD technique. The insulating film 7 is formed by the anisotropic etching technique, so that the amount of dimensional conversion is minimized relative to the size of the photoresist mask 26. It is allowed to increase the threshold voltage of the parasitic MISFET among the capacitors which comprises the conductive plate, insulating films 4, 7, and semiconductor region 5. The insulating film 7 is left on the peripheral circuits until some of the steps for forming memory cells are finished, i.e., until the capacitors are formed, and is used as a mask for effecting a variety of processing steps This eliminates some steps for forming masks, and contributes to reducing the number of manufacturing steps. The insulating film 4 is effectively used as an etching stopper in etching the insulating film 7. By utilizing the selectivity of etching relative to the insulating film 7, furthermore, the insulating film 4 can be removed by an isotropic (wet) etching technique (mentioned later) maintaining unchanged the thickness of the insulating film for isolating capacitors and achieving only a very small amount of dimensional conversion Moreover, the main surface of the semiconductor region 5 is not damaged and leakage current of the capacitor can be reduced.

Figure 9:
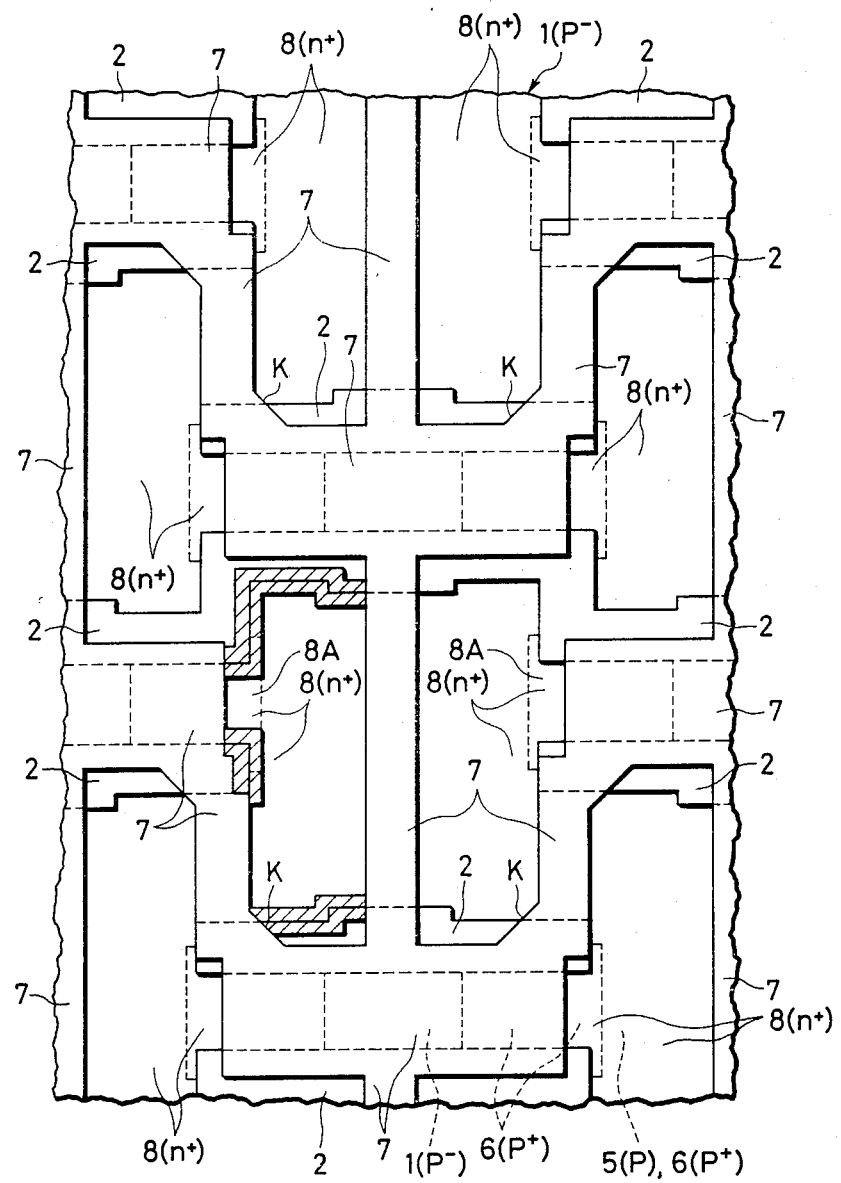

As shown in FIGS. 9, 20A and 20B, the n+-type semiconductor region 8 is formed extending to the main surface of the substrate by using the mask 26 and the field insulating film 2 as a mask, thereby to form the first and second capacitor portions of the capacitor. A portion 8A of the semiconductor region 8 is so formed as to bite into the source region or the drain region at a portion where the source region or the drain region of the switching MISFET is connected to the capacitor. Therefore, even if the mask is mis-aligned (chiefly in the direction of rows) during the step of manufacturing, the electric connection is maintained between the capacitor and switching MISFET The semiconductor region 8 is formed being self-aligned with the field insulating film 2, and the distance is maintained sufficiently with respect to the source region or the drain region of the switching MISFET of a neighboring memory cell. This makes it possible to prevent the leakage of current and to improve electric reliability. The semiconductor region 8 is formed, e.g., by implanting impurities (As ions) at a concentration of, for example, about $1 \times 10^{14}$ atoms/cm$^2$ with the energy of about 100 KeV, followed by diffusion after the mask 26 is removed.

As is obvious from FIGS. 9, 20A and 20B, the insulating film tends to develop deviation in aligning the mask with the field insulating film 2. The masking deviation in the direction of columns is absorbed by the width of the field insulating film 2 like the aforementioned mask 24, and there is no increase or decrease in the storage of electric charge, that serves as data, of the capacitor. The masking deviation in the direction of rows causes the storage of charge, that serves as data, to increase or decrease. However, since the masking deviation causes the area to change very little with respect to the area of the capacitor, increase or decrease of the storage of charge that serves as data can be neglected By cutting away a predetermined corner K of the insulating film 7 at an angle of about 45 degrees, a sufficient distance is maintained between the semiconductor regions 8 which constitute the neighboring capacitor. Therefore, the current is restrained from leaking and electric reliability is improved. The insulating film 7 is provided between the word lines so as to extend in the same direction as the word lines. As will be described later, the insulating film 7 works as an etching stopper to prevent short-circuiting between the word lines. Part of the shape of the capacitor is not formed by selectively oxidizing the substrate but is formed by the insulating film 7 that is deposited, and error in the amount of dimensional conversion is very small relative to the size of mask. Another part of the shape of the capacitor is defined by the field insulating film 2, and causes the capacitor area to increase or decrease to some extent depending upon the amount of dimensional conversion of the field insulating film 2 as indicated by hatched lines in FIG. 9. The increment or decrement of area can be reduced by selecting the insulating film 7 that defines the shape of the capacitor to be larger than the amount by which the field insulating film 2 is exposed. This, however, imposes strict limitation on the distance (pitch) among the data lines. Therefore, the degree of increment or decrement should be suitably selected.

Using the insulating film 7 as a mask for etching, the insulating film 4 is removed from the capacitor-forming region. The insulating film 4 is removed by the isotropic etching technique, which provides the etching of the insulating film while the main surface of the semiconductor region 8 is damaged very little As shown in FIG. 21, an insulating film 9 is newly formed on the main surface of the semiconductor region 8 from which the insulating film 4 has been removed. The insulating film 9 is formed to have a thickness of as small as about 12 to 15 nm by using a silicon oxide film that is formed by thermally oxidizing the substrate with the insulating film 7 as a mask. Since the main surface of the semiconductor region 8 is damaged very little, the insulating film 9 features good film quality.

Figure 10:
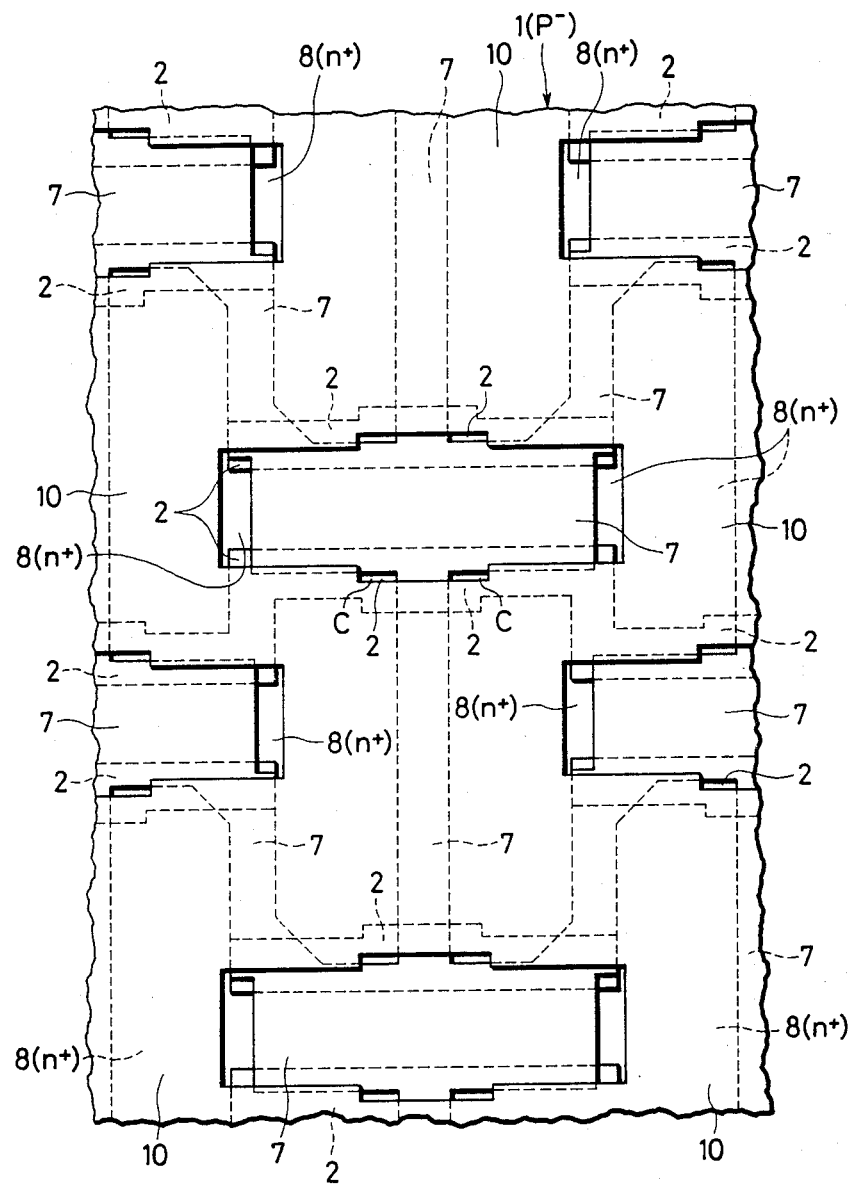

Then, as shown in FIGS. 10 and 22, a conductive plate 10 is formed on the predetermined portions of insulating film 9, insulating film 7 and field insulating film 2, in order to form a major capacitor portion of the capacitor. For instance, impurities (P) are introduced into the polycrystalline silicon film formed by the CVD technique on the whole surface of the substrate to a thickness of 400 nm, in order to decrease the electric resistance. Thereafter, the conductive plate 10 is formed on the region 8 by the photolithography as shown in FIG. 22. With the conductive plate 10 and the insulating film 7 being formed, a recessed portion (window) C tends to develop in a portion where neither the conductive plate 10 nor the insulating film 7 exists and where the switching MISFET's of a memory cell and of another memory cell are opposed. Particularly, if the masking deviates in the direction of columns relative to the insulating film 7, the word lines tend to be short-circuited due to the remaining conductive plate that is not removed by etching Therefore, the insulating film 7 is provided under the conductive plate 10 in such a manner that they are necessarily stacked even partly even in case the masking is deviated in the direction of the columns, such that the remaining conductive plate that is not removed by etching will not cause the word lines to be short-circuited. Namely, the insulating film 7 formed between the capacitors of the neighboring memory cells also works to prevent the word lines from short-circuiting.

Next, as shown in FIG. 23, the whole surface is subjected to the etching step (washing step) in order to form an insulating film that electrically isolates the conductive plate 10 from the electrically conductive layer formed thereon. In particular, the insulating film 9 is removed from portions other than the portions covered by the conductive plate 10. The field insulating film 2 is partly removed at the window C that is formed by the masking deviation between the insulating film 7 and the conductive plate 10 in the washing step or in the subsequent washing step, whereby an undesired under-cut portion may be formed as indicated by A in FIG. 23. The under-cut portion A causes the word lines to be short-circuited in the subsequent manufacturing steps. On the field insulating film 2 between the capacitors, the insulating film 7 is provided as indicated by B in FIG. 23 and is used as an etching stopper, eliminating the probability of forming undesired under-cut portion. In accordance with the present invention, therefore, the under-cut portion A is not formed In order to clarify the effects of the present invention in FIG. 23 and in the subsequent drawings, the portion A where the under-cut is formed is shown together with the portion B where the under-cut is not formed.

An insulating film 11 is formed to cover the conductive plate 10 by using, as an oxidation impermeable mask, the insulating film 7 that is formed on the switching MISFET-forming region The insulating film 11 is formed by thermally oxidizing the conductive plate 10 which comprises a polycrystalline silicon film to which impurities have been introduced, so that the oxidation rate thereof is increased. The insulating film 11 has a thickness of, for example, about 300 nm The insulating film 7 formed on the switching MISFET-forming region is used as an insulating film for isolation, as a mask for introducing impurities, and as a thermal oxidation impermeable mask in the step of forming the insulating film 11. That is, the insulating film 7 is used to serve as a variety of masks, and contributes to reducing the number of steps for forming masks and eventually to reducing the number of manufacturing steps.

In the step of forming the insulating film 11, a thick insulating film 11A is formed on a portion where the capacitor and the switching MISFET are connected together and where a margin is provided for aligning the masks between the insulating film 7 and the conductive plate 10. However, since the semiconductor region 8 (8A) is so formed as to penetrate into the under part of the insulating film 11A with the insulating film 7 as a mask for introducing impurities, the capacitor and the switching MISFET are electrically connected together, maintaining increased reliability. The insulating film 11 where the under-cut portion A is formed has an overhanging shape, and the portion B where the under-cut portion A is not formed owing to the insulating film 7 does not have the overhanging shape.

Figure 11:
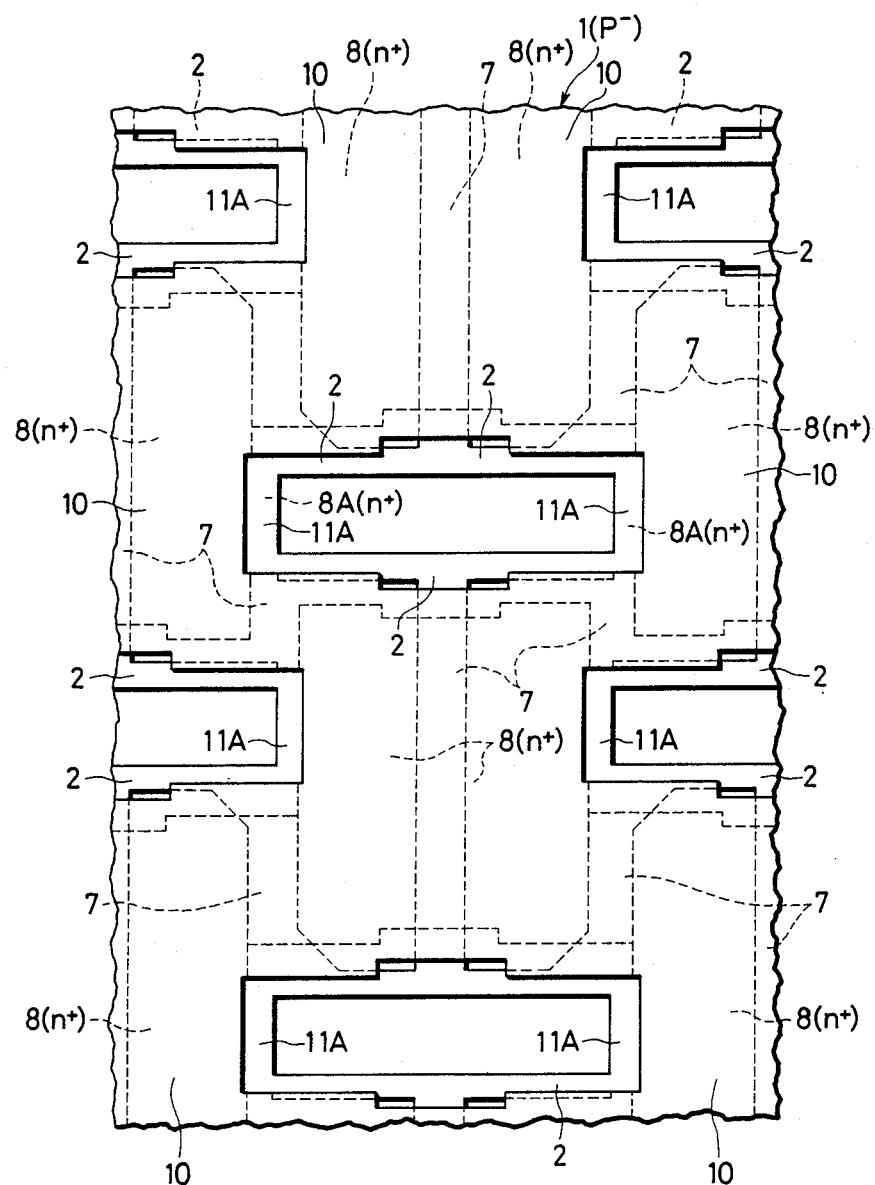
Figure 24A:
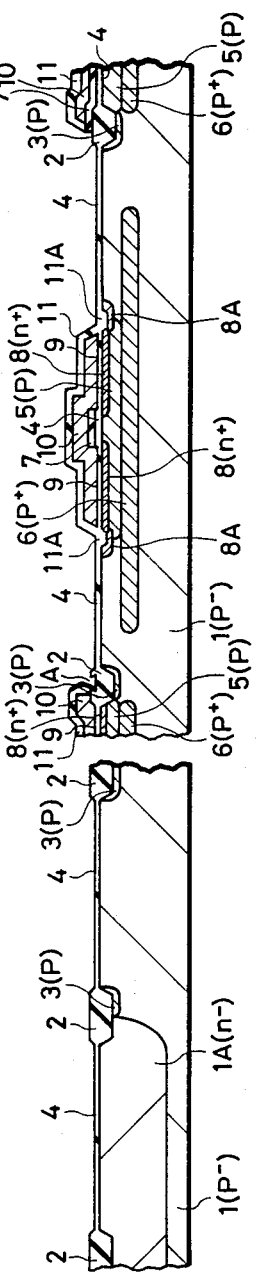
Figure 24B:
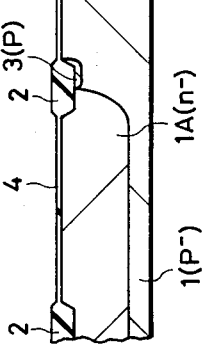

Next, as shown in FIGS. 11, 24A and 24B, the silicon nitride film 7 is removed from the switching MISFET-forming region in the memory cell array and from the complementary MISFET-forming region of the peripheral circuits, by using silicon oxide films 11 and 11A as masks for etching.

Thereafter, using the thick insulating films 11, 11 A as masks for etching, the thin insulating film 4 is removed from the switching MISFET-forming region and from the complementary MISFET-forming region.

Referring to FIGS. 25A and 25B, an insulating film 12 is formed on the main surface of the semiconductor substrate 1 and the well region 1A that is exposed by the removal of insulating film 4 in order to form a gate insulating film of the MISFET's. The insulating film 12 comprises a silicon oxide film that is formed, for example, by thermally oxidizing the substrate, and has a thickness of about 12 to 15 nm. After the insulating film 12 is formed, impurities are introduced into the main surfaces of the semiconductor substrate 1 and the well region 1A to adjust the threshold voltage of the MISFET's In particular, the well region 1A has the channel stopper region 3 that is formed on one side only and, hence, has a high impurity concentration. In order to lower the threshold voltage of the p-channel MISFET, therefore, impurities are introduced into the well region 1A in a concentration greater than that of the semiconductor substrate 1.

Thereafter, a conductive layer 13 is formed on a predetermined portion of the insulating film 12 and on the insulating film 11 so as to be used as a gate electrode of a MISFET or as a word line WL. The conductive layer 13 is comprised of a polycrystalline silicon film formed by the CVD technique and to which predetermined impurities (P) have been introduced and a tungsten silicide film which is formed thereon by sputtering, as is known in the art. The conductive layer 13 is, therefore, composed of stacked films The polycrystalline silicon film has a thickness of, for example, about 200 nm, and the tungsten silicide film has a thickness of, for example, about 300 nm. The conductive layer 13 is formed, for example, by forming the stacked films on the whole surface of the substrate followed by patterning which is based upon the anisotropic etching technique.

In the step of forming the conductive layer 13, the conductive layer may often be undesirably left, without being removed by etching under (in the under-cut portion A of) the overhanging insulating film 11 due to good step coverage of the polycrystalline silicon film. The conductive layer may cause the neighboring conductive layers (word lines WL) to be short-circuited. However, since the insulating film 7 is formed between the neighboring conductive layers 13 to prevent the development of under-cut portion A and the overhanging insulating film 11, the short-circuit is reliably prevented from occurring.

In order to form an n-channel MISFET of the LDD structure, n-type semiconductor regions 14 are formed in the main surface of the conductive layer 13 in the n-channel MISFET-forming region as shown in FIGS. 25A and 25B. The semiconductor regions 14 are formed using field insulating film 2, insulating films 11, 11A and conductive layer 13 as masks. The semiconductor regions 14 are formed by implanting impurities (e.g., phosphorus ions) at a concentration of about $1 \times 10^{13}$ atoms/cm$^2$ with the energy of about 60 KeV via the insulating film 12, followed by diffusion. The semiconductor regions 14 are formed being self-aligned with the field insulating film 2, and are separated away from the semiconductor regions 5, 8 maintaining a predetermined distance in the memory cell array. Therefore, leakage is restrained between the capacitor of a neighboring memory cell and the switching MISFET of the memory cell, and electric reliability is improved. The p-channel MISFET-forming region is covered with a mask 27 which is made of a photoresist or the like, so that the semiconductor region 14 will not be formed therein.

After the mask 27 is removed, side wall spacers (masks) 15 are formed in a self-aligned manner on both sides of the conductive layer 13 in order to form the source region or the drain region of the MISFET's. The masks 15 are formed by subjecting the silicon oxide film formed on the whole surface of the substrate by the CVD technique to an anisotropic etching such as reactive ion etching (RIE) That is, the masks 15 are formed on the side walls of gate electrodes of all MISFET's. In the step of forming masks 15, the insulating film 12 is removed except under the conductive layer 13 and the portions of masks 15, so that main surfaces of the semiconductor substrate 1 and the well region 1A are exposed. Thereafter, an insulating film 12A is formed on the exposed main surfaces of the semiconductor substrate 1 and the well region 1A, in order to avoid contamination that may be caused in the step of introducing impurities.

Figure 12:
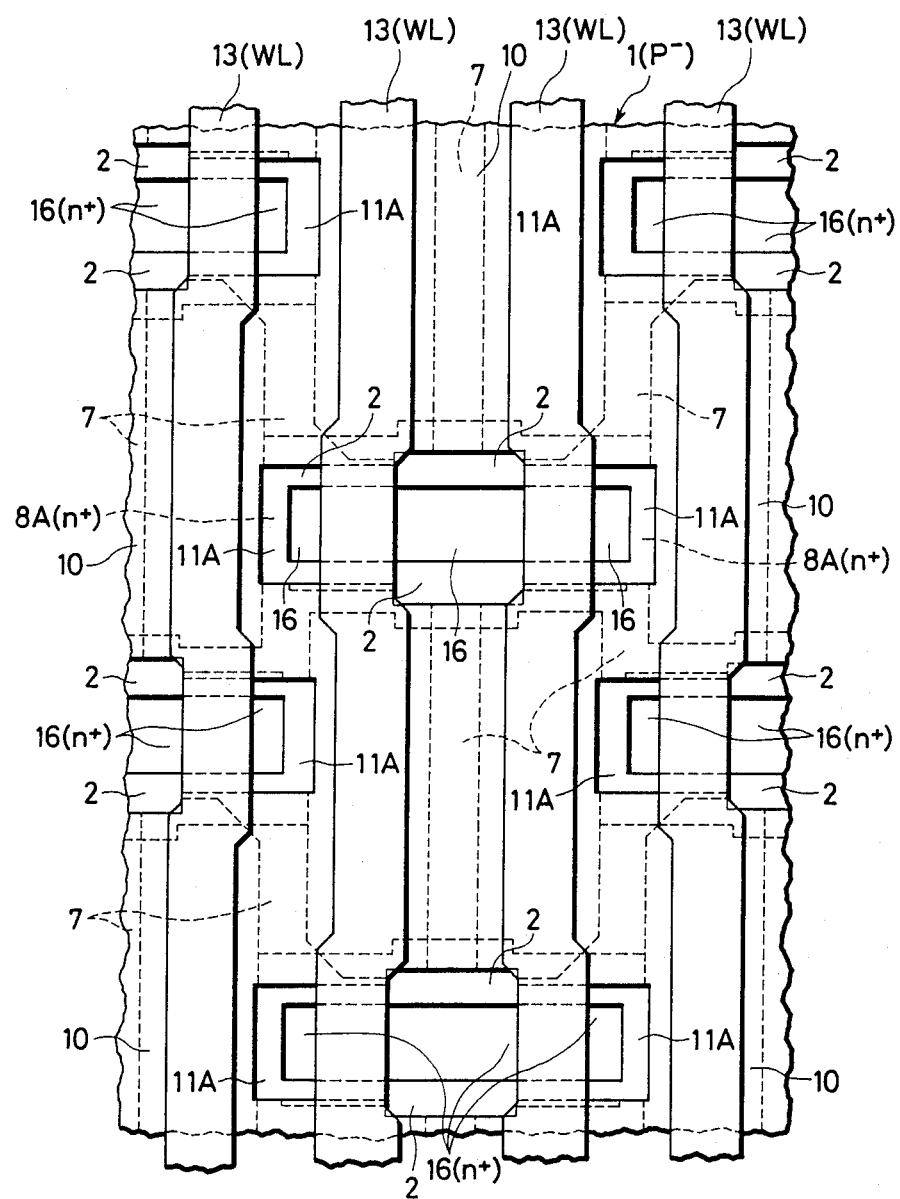

Then, as shown in FIGS. 12, 26A and 26B, an n+-type semiconductor region 16 is formed in the main surface of the semiconductor substrate 1 so as to be electrically connected to the semiconductor regions 14 and to a portion (8A) of the semiconductor region 8, by using masks 15. The semiconductor region 16 is formed, for example, by implanting impurities (arsenic ions) at a concentration of about $5 \times 10^{15}$ atoms/cm$^2$ with the energy of about 80 KeV via the insulating film 12A, followed by diffusion Like the semiconductor regions 14, the semiconductor region 16 is formed being self-aligned with the field insulating film 2 and being separated away from the semiconductor regions 5, 8 by a predetermined distance. This helps restrain the leakage between the data-storing capacitor of a neighboring memory cell and the switching MISFET of the memory cell, and improves electric reliability. The p-channel MISFET-forming region is covered with a mask 28 made of a photoresist or the like that is newly formed after the masks 15 are formed, so that the semiconductor region 16 will not be formed therein.

Then, as shown in FIGS. 27A and 27B, a mask 29 made of a photoresist is so formed as to cover the region for forming the memory cell array and to cover n-channel MISFET's in the peripheral circuits. P-type impurities are then introduced into the main surface of the well region 1A by using mask 29, field insulating film 2 and conductive layer 13 as masking layers. After the mask 29 is removed, the p-type impurities are diffused to form a p+-type semiconductor region 30 where a p-channel MISFET is to be formed. For example, region 30 can be formed by introducing boron ions, as the p-type impurities, by ion implantation at $1 \times 10^{15}$/cm$^2$ and 60 KeV, and then diffusing the ions for activation at 950° C. for 10 minutes. Thus, the complementary MISFET's are formed to constitute a peripheral circuit.

As shown in FIGS. 28A and 28B, an insulating film 17 is formed on the whole surface of the substrate to cover the transistor, capacitor and conductive layer 13. The insulating film 17 is composed of a stacked film that is obtained by forming a silicon oxide film by the coating technique (conventional spin on glass coating technique) on a phosphosilicate glass (PSG) film that is formed by the CVD technique, so that the upper surface thereof is flattened The PSG film may have a different phosphorus concentration. Concretely speaking, the insulating film 17 consists of a PSG film having a thickness of about 5000 angstroms and a phosphorus concentration of about 4 mol %, and a silicate glass film (i.e., $SiO_2$ film) which has a thickness of about 1000 angstroms without containing phosphorus, and which is formed thereon. Thereafter, connection holes 18 are formed as shown in FIGS. 28A, 28B by removing the insulating films 12A, 17 on the semiconductor regions 16 to be connected to the data lines and on the semiconductor regions 16, 30 of the MISFET-forming regions in the peripheral circuits. The connection holes 18 are formed in the p-channel and n-channel MISFET-forming regions through the same step. The connection holes 18 can be formed by conventional techniques used to form connection holes Moreover, techniques for forming connection holes are described in U.S. application Ser. No. 800,954, filed Nov. 22, 1985, the contents of which are incorporated herein by reference.

After a mask 31 made of a photoresist is formed on the p-channel MISFET-forming region, impurities (phosphorus ions) are implanted into the main surface of the semiconductor region 16 or into the deeper main surface of the semiconductor substrate 1 via connection holes 18, in order to form an $n^+$-type semiconductor region 19 having a larger junction depth than the semiconductor region 16 as shown in FIGS. 29A and 29B. The semiconductor region 19 is formed by diffusing impurities that are introduced after the mask 31 is removed. By forming the semiconductor region 19 by implanting ions, the connection holes 18 can be formed in the p-channel and n-channel MISFET-forming regions through the same step. Therefore, the connection holes 18 can be formed through a reduced number of steps compared with when the semiconductor region 19 is formed by the diffusion technique.

Then, as shown in FIGS. 3 and 4, a conductive layer 20 is formed to extend on the insulating film 17 so as to be electrically connected to the predetermined semiconductor regions 16, 30 The conductive layer 20 which extends in the direction of rows in the memory cell array forms a data line DL or a column select line YS. The conductive layer 20 is composed, for example, of an aluminum film of an aluminum film containing impurities (e.g., silicon and/or copper), as known in the art, formed by sputtering. Preferably, the conductive layer 20 is composed of a stacked film of a lower aluminum film which contains about 2% by weight of silicon and an upper aluminum film which contains about 3% by weight of copper and about 1.5% by weight of silicon. The lower aluminum film works to stabilize the interface relative to the semiconductor regions 16, 30, and the upper aluminum film works to reduce migration of aluminum, e.g., with the substrate. The upper aluminum film contains silicon in order to restrain the degree of solid solution of silicon of the whole conductive layer 20 and to prevent aluminum spike. Silicon, however, need not necessarily be contained in the upper aluminum film. It has been confirmed through experiments by the inventors that the connection resistance increases remarkably if the p-type semiconductor region 30 of an impurity concentration of greater than $1 \times 10^{19}$ atoms/cm$^2$ is directly connected to the aluminum film which contains copper and silicon. In this embodiment, therefore, an aluminum film containing silicon is provided therebetween so that the connection (contact) resistance does not increase. It has also been confirmed by the inventors that the connection resistance does not increase too much when the p-type semiconductor region 30 having an impurity concentration of $5 \times 10^{19}$ atoms/cm$^2$ is connected in series with the aluminum film which contains copper and silicon. Namely the impurity concentration of the semiconductor region 30 may be selected to be greater than the above-mentioned value, in order to restrain the connection resistance between the conductive layer 20 and the semiconductor region 30 from increasing.

Then, a surface protection film is formed, and the DRAM of the first embodiment is completed through a series of the aforementioned manufacturing steps.

In the first embodiment, the switching MISFET Q of the memory cell is based upon the LDD structure which, however, need not necessarily be adopted. It is also allowable to employ the LDD structure for the switching MISFET Q of a memory cell, and to provide a $p^+$-type semiconductor region under the LDD portion (semiconductor region 14) in order to restrain the development of punch-through between the source region and the drain region. It is also allowable to employ a known double drain structure, in which the source region or drain region of the switching MISFET of the memory cell is constituted by a semiconductor region of a high impurity concentration and a semiconductor region of a low impurity concentration. It is further allowable to provide a $p^-$-type well region in the $n^-$-type semiconductor substrate and to constitute a memory cell array in the well region. The mask 15 may be removed through a predetermined manufacturing step, and need not exist when the DRAM is completed.

FIGS. 30A and 30B are diagrams for explaining a modified structure of the first embodiment of the present invention, wherein FIG. 30A is a section view illustrating major portions of the memory cell array of DRAM, and FIG. 30B is a section view illustrating major portions of complementary MISFET's which constitute a peripheral circuit of DRAM.

In FIGS. 30A and 30B, reference numeral 32 denotes an insulating film which is provided on the whole surface of the substrate so as to cover the conductive layer 20. The insulating film 32 electrically- isolates the conductive layer (first aluminum layer) 20 from a conductive layer (second aluminum layer) 34 formed thereon.

The insulating film 32 is composed of a stacked film that is obtained by successively laminating a silicon oxide film formed, for example, by the plasma CVD technique, a silicon oxide film formed thereon by the coating (spin on glass) technique, and a silicon oxide film formed thereon by the plasma CVD technique The silicon oxide film of the lower layer can be formed at a low temperature within a short period of time to have a large hardness and a dense film quality, and works to prevent the conductive layer 20 which is weakly adhered to the insulating film 17 from peeling off therefrom or from undesirably moving, and further works to prevent hillocks from developing the silicon oxide film of the lower layer has a thickness of about 2000 angstroms. The silicon oxide film of the middle layer has a flowability in the step when it is being formed, and works to restrain undulation from growing when the layers are laminated, and to flatten the upper surface of the insulating film 32. The silicon oxide film of the middle layer has a large thickness in a portion of a large undulation and tends to develop cracks. Therefore, the silicon oxide film of the middle layer should have a thickness of about 1500 to 1700 angstroms. The silicon oxide film of the upper layer has a dense film quality. When the DRAM is sealed with a sealing material, therefore, the silicon oxide film prevents the infiltration of moisture from the sealing material or from the outside. The silicon oxide film of the upper layer has a thickness of about 6000 angstroms Here, silicon nitride films formed by the CVD technique may be used as the lower layer and the upper layer. To form the silicon nitride film by the plasma CVD technique, ammonia gas containing hydrogen is used as a source gas. Therefore, hydrogen easily traps hot carriers that are generated by the operation of the MISFET, and there remains the probability that the threshold voltage of the MISFET undergoes a change.

Reference numeral 33 denotes a connection hole which is formed by removing a predetermined portion of the insulating film 32 on the conductive layer 20. The connection hole 33 is formed by an isotropic etching technique to have a shape of a combination of arcuate shape and pole-like shape as shown in FIG. 30B. Namely, the arcuate shape of the upper portion reduces a steep step of the connection hole 33, and the pole-like shape of the lower portion makes the connection hole 3 fine. This helps reduce the area required for the connection hole 33 and improves connection between the conductive layers 20 and 34.

The conductive layer 34 is electrically connected to the conductive layer 20 at a predetermined portion passing through the connection hole 33, and extends on the insulating film 32. The conductive layer 34 extends in the memory cell array in, for example, a direction the same as that of the conductive layer 13 that serves as the word line WI and is electrically connected thereto at a predetermined portion (not diagrammed). The conductive layer 34 is composed of a conductive material having a sheet resistance smaller than that of the conductive layer 13, and helps reduce the resistance of the conductive layer (WL) 13 and increase the speed of write operation and rad operation of the DRAM.

The conductive layer 34 is formed by the step of forming a fourth conductive layer, and is composed of, for example, an aluminum film or an aluminum film which contains predetermined impurities, like the conductive layer 20. The DRAM of this example has a two-layer wiring (conductive layers 20, 34) structure composed of aluminum films.

As described above, this example makes it possible to obtain nearly the same effects as those of the first embodiment.

Furthermore, the insulating film 32 provided between the conductive layer 20 and the conductive layer 34 sandwiches the insulating film that is formed by the coating technique in cooperation with the insulating film that is formed by the plasma CVD technique, making it possible to prevent the conductive layer 20 from undesirably moving, to flatten the upper surface of the insulating film 32 and to increase resistance against humidity.

The first embodiment has dealt with the case where the memory cells were formed in a shape midway between the T-shape and the L-shape. A second embodiment will now deal with the case where the memory cells of the DRAM are formed in the T-shape.

Figure 31:
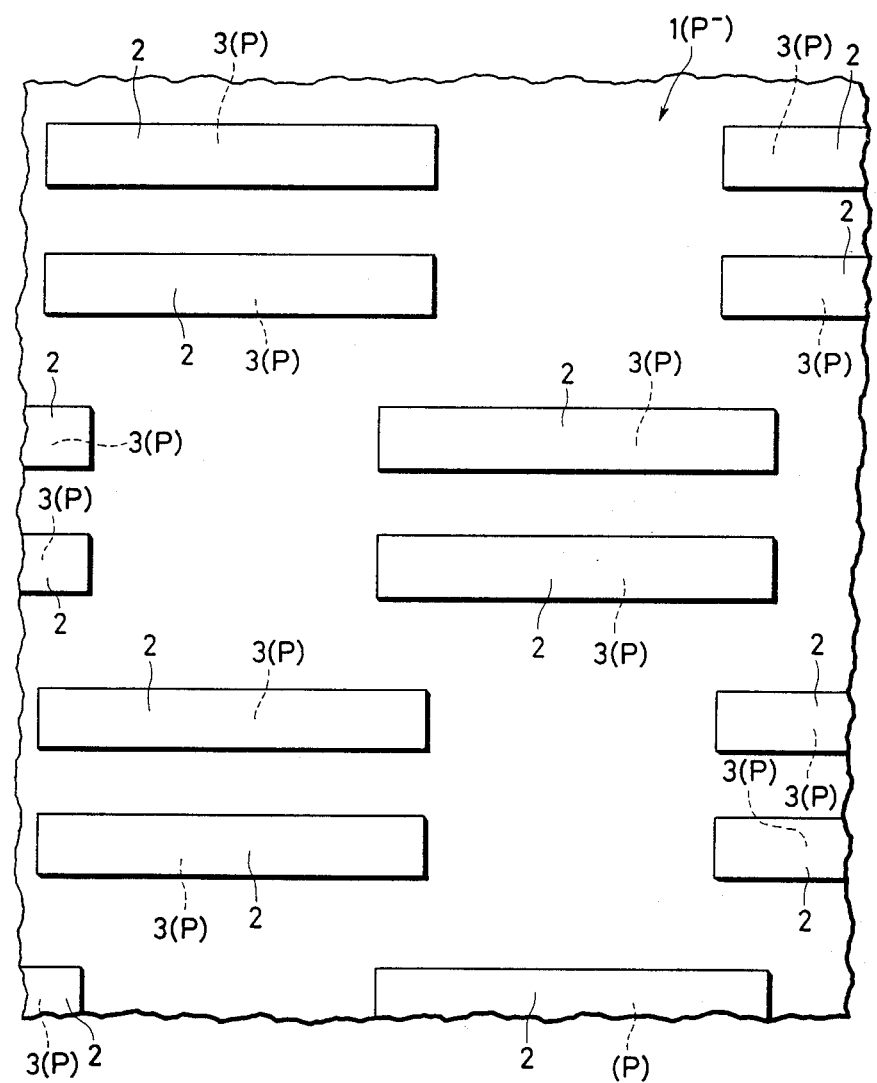
FIGS. 31 to 33 are plan views of memory cells during various manufacturing steps according to a second embodiment of the present invention.
Figure 32:
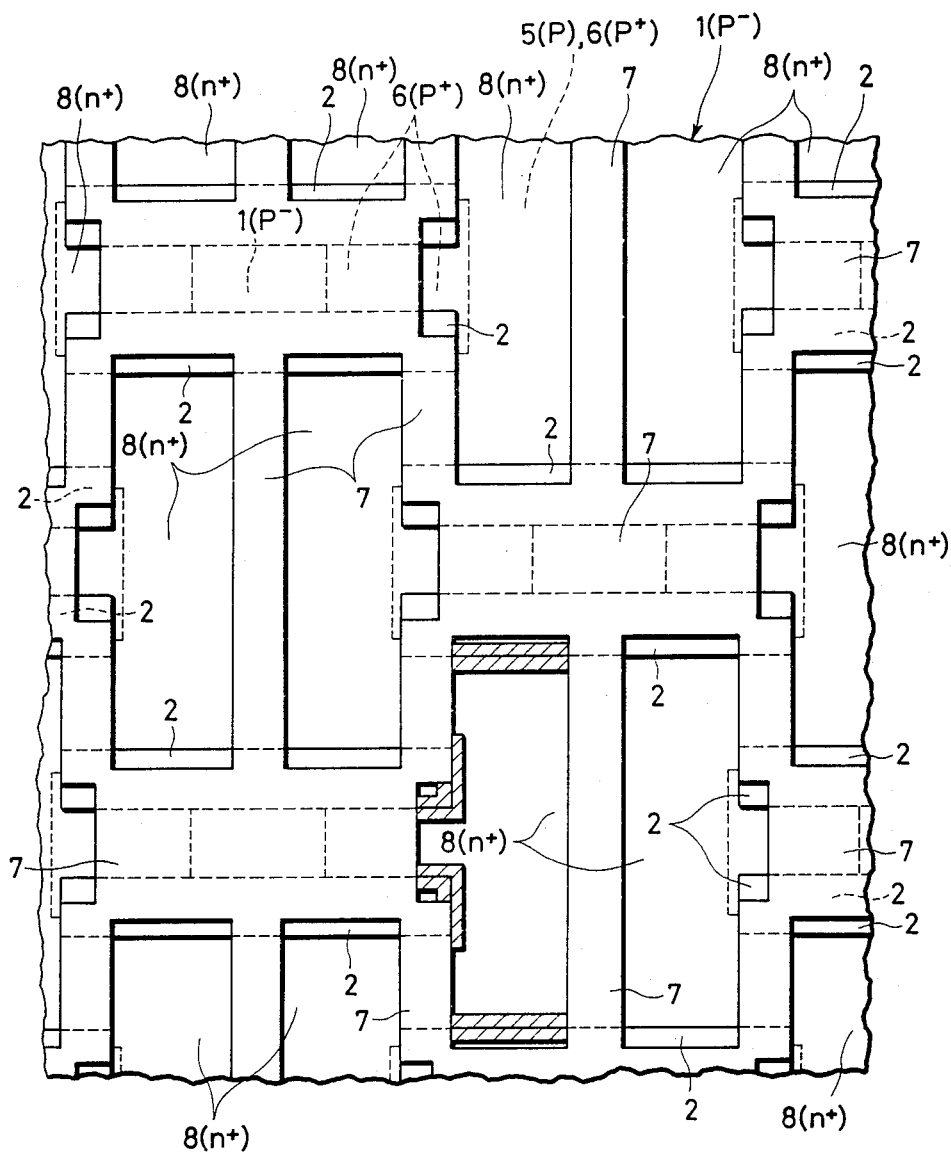
Figure 33:
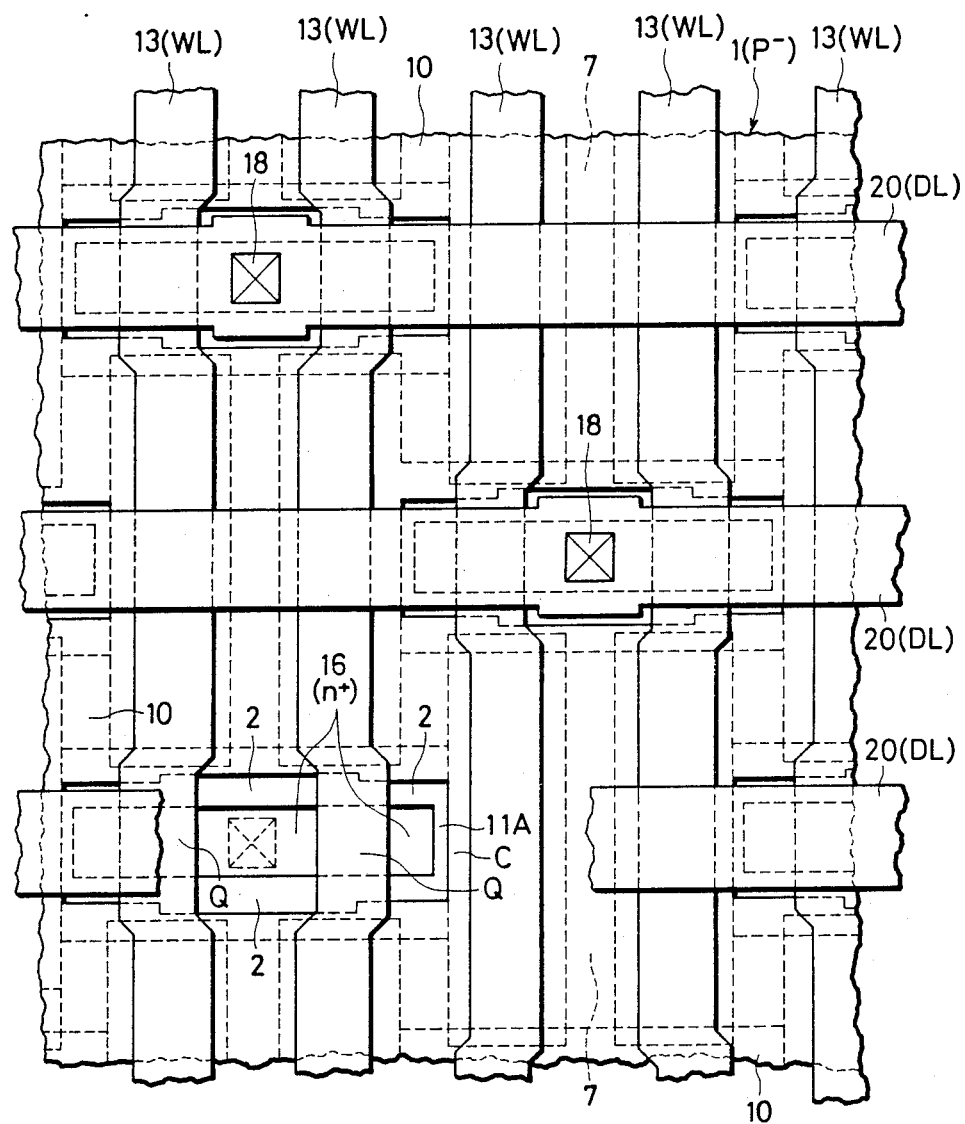

FIGS. 31 to 33 are plan views showing major portions of the memory cell array of the DRAM in each of the manufacturing steps to explain the structure and the manufacturing process according to the second embodiment of the present invention.

Field insulating films 2 which define the gate width of the switching MISFET, according to the second embodiment, are arranged maintaining nearly the same distance in a direction in which the conductive layers (data lines DL) 20 extend, as shown in FIGS. 31 to 33. The field insulating films 2 are also arranged maintaining nearly the same distance in a direction in which the conductive layers (word lines 14L) 13 extend. That is, the memory cell is formed in the T-shape in which the data-storing capacitor has a symmetrical shape with respect to the switching MISFET (conductive layer 20).

As shown in FIG. 33, the T-shaped memory cell has a margin in the pitch of the conductive layers 20 compared with the memory cell of the L-shape or of a shape midway between the L-shape and the T-shape. Here, the second embodiment has no column select line YS.

Further, a difference of size develops due to the field insulating films 2 in the hatched portions of FIG. 32, and the area of the data-storing capacitor decreases to some extent, i.e., the storage of charge, that serves as data, decreases to some extent. Decrease in the storage of electric charge or data becomes greater than that of the memory cell of the L-shape or of a shape midway between the L-shape and the T-shape.

The second embodiment makes it possible to obtain nearly the same effects as those of the aforementioned first embodiment.

In the DRAM in which the memory cells are comprised of series circuits of a switching MISFET and a data-storing capacitor, furthermore, the memory cells are formed in the T-shape by defining a portion of the shape of the capacitor by an insulating film 7 that is formed by deposition, and by forming a portion of the shape of the switching MISFET by the field insulating film 2 that is formed by oxidizing the semiconductor substrate 1. Therefore, a margin is imparted to the distance of conductive layers 20 that serve as data lines compared with the memory cells of the L-shape or of a shape midway between the L-shape and the T-shape.

Figure 34:
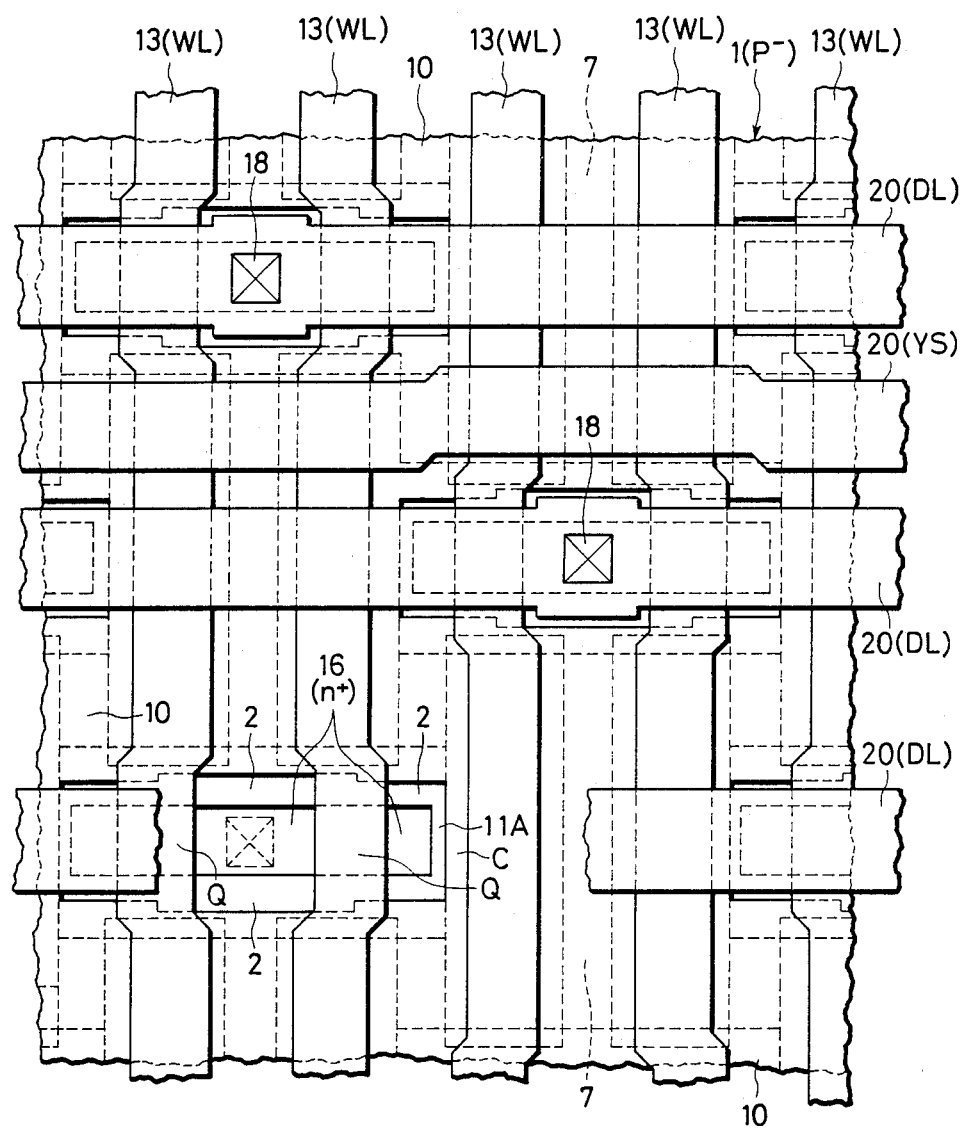
FIG. 34 is a plan view illustrating a modified example of the second embodiment.

FIG. 34 shows the second embodiment wherein column select lines YS comprising conductive layers 20 are formed like in the first embodiment. Here, attention should be given to the fact that the distance becomes very small between the data line DL and the wiring YS. Therefore, though the data line DL is straight, the column select line YS is bent near the contact hole 18 so as to be slightly separated away from the data line.

A third embodiment deals with the case where the DRAM has memory cells of the L-shape.

Figure 35:
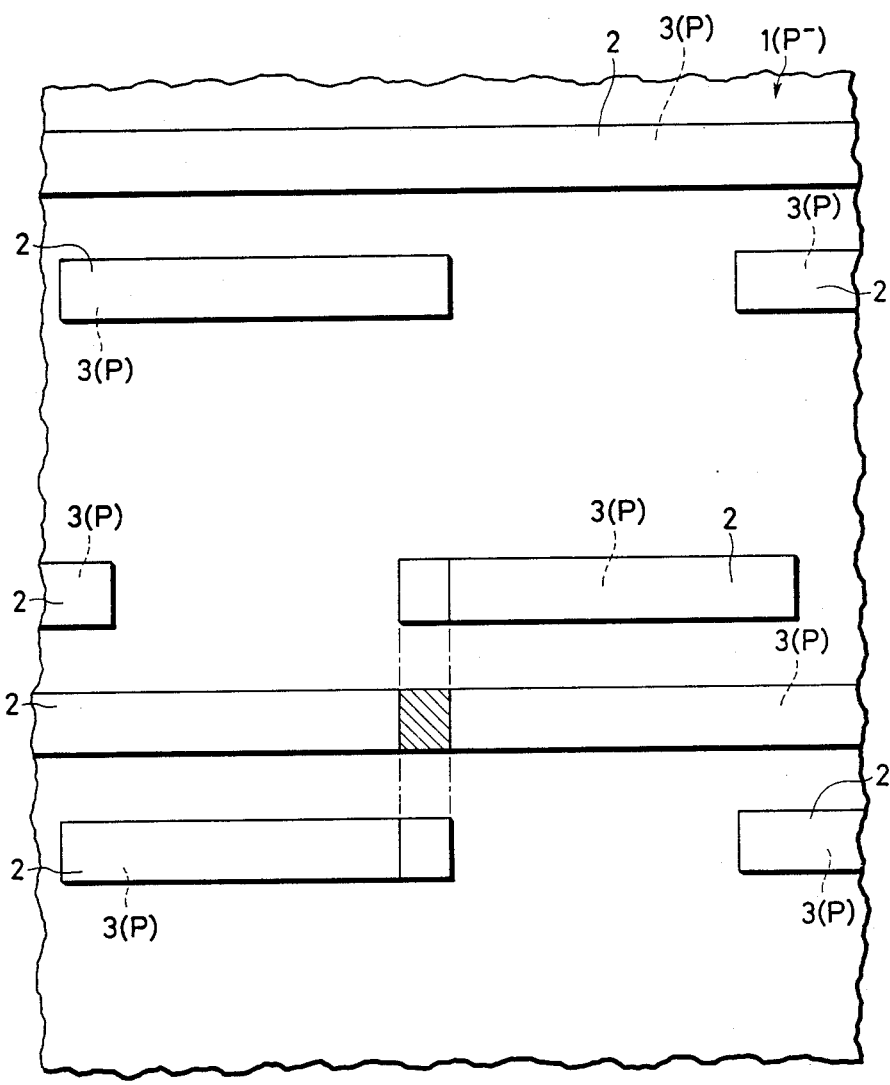
FIGS. 35 to 37 are plan views of memory cells during various manufacturing steps according to a third embodiment of the present invention.
Figure 36:
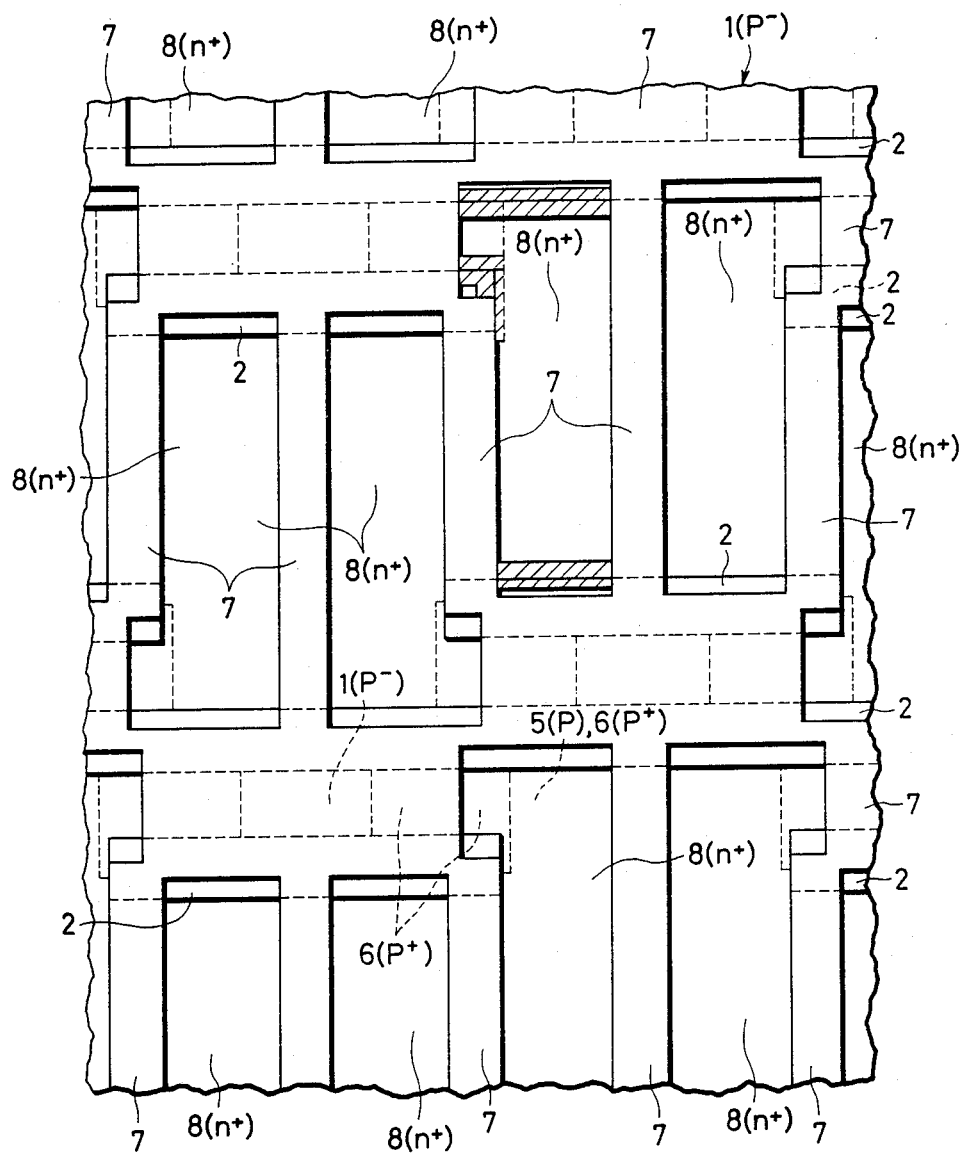
Figure 37:
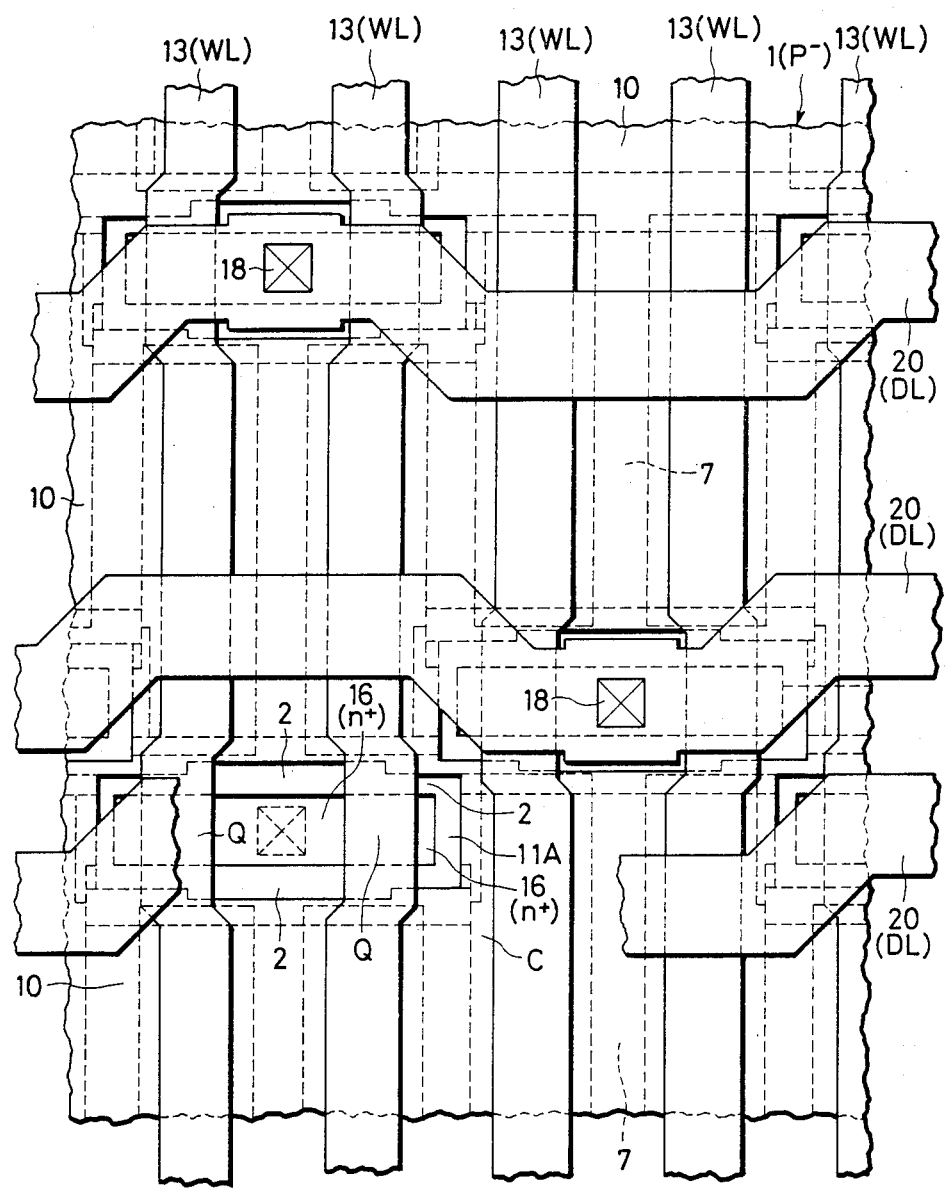

FIGS. 35 to 37 are plan views showing major portions of the memory cell array of the DRAM in each of the manufacturing steps to explain the structure and the manufacturing process according to the third embodiment of the present invention.

Field insulating films which define the gate width of switching MISFET's according to the third embodiment are arranged maintaining nearly the same pitch in the direction in which the conductive layers 20 extend. The field insulating films 2 are further arranged maintaining two different distances in a direction in which the conductive layers 13 extend. That is, the memory cell is constituted in the L-shape in which the data-storing capacitor is asymmetrically formed with respect to the switching MISFET.

As shown in FIG. 37, the memory cell of the L-shape has a margin in the pitch of conductive layers 20 for every predetermined pitch but also has a strict limitation on the pitch of conductive layers 20 for every predetermined pitch compared with the memory cell of the T-shape or of a shape midway between the L-shape and the T-shape. This, however, is advantageous when the column select lines YS are to be formed, though not diagrammed. That is, a column select line YS can be formed between a pair of data lines DL having a margin among the data lines DL. In this case, the gas between the data line DL and the column select line YS is not as strict as the gap of FIG. 34. The data lines DL are formed in a zig-zag manner since the positions of contact holes 18 are partial.

A field insulating film 2 which defines the gate width of the switching MISFET is overlapped on another field insulating film 2 which defines the gate width of another neighboring switching MISFET as indicated by hatched lines in FIG. 35. With the field insulating films 2 being overlapped, the areas of the field insulating films 2 can be reduced by an amount where they are overlapped.

A difference develops in the size due to the field insulating films 2, as indicated by hatched lines in FIG. 36, and the area of the capacitor, i.e., the storage of the charge or data, decreases to some extent. The storage of charge or data decreases by an amount smaller than that of the memory cell of the T-shape or of a shape midway between the L-shape and the T-shape.

The third embodiment produces nearly, the same effects as the aforementioned first embodiment.

In the DRAM in which the memory cells are comprised of series circuits of a switching MISFET and a data-storing capacitor, furthermore, the memory cells are formed in the L-shape by defining a portion of the shape of the data-storing capacitor by the insulating film 7 that is formed by deposition, and by forming a portion of the shape of the switching MISFET by the field insulating film 2 that is formed by oxidizing the semiconductor substrate 1. Therefore, the storage of charge or data is reduced by an amount smaller than that of the memory cells of the T-shape or of a shape midway between the L-shape and the T-shape.

Figure 38:
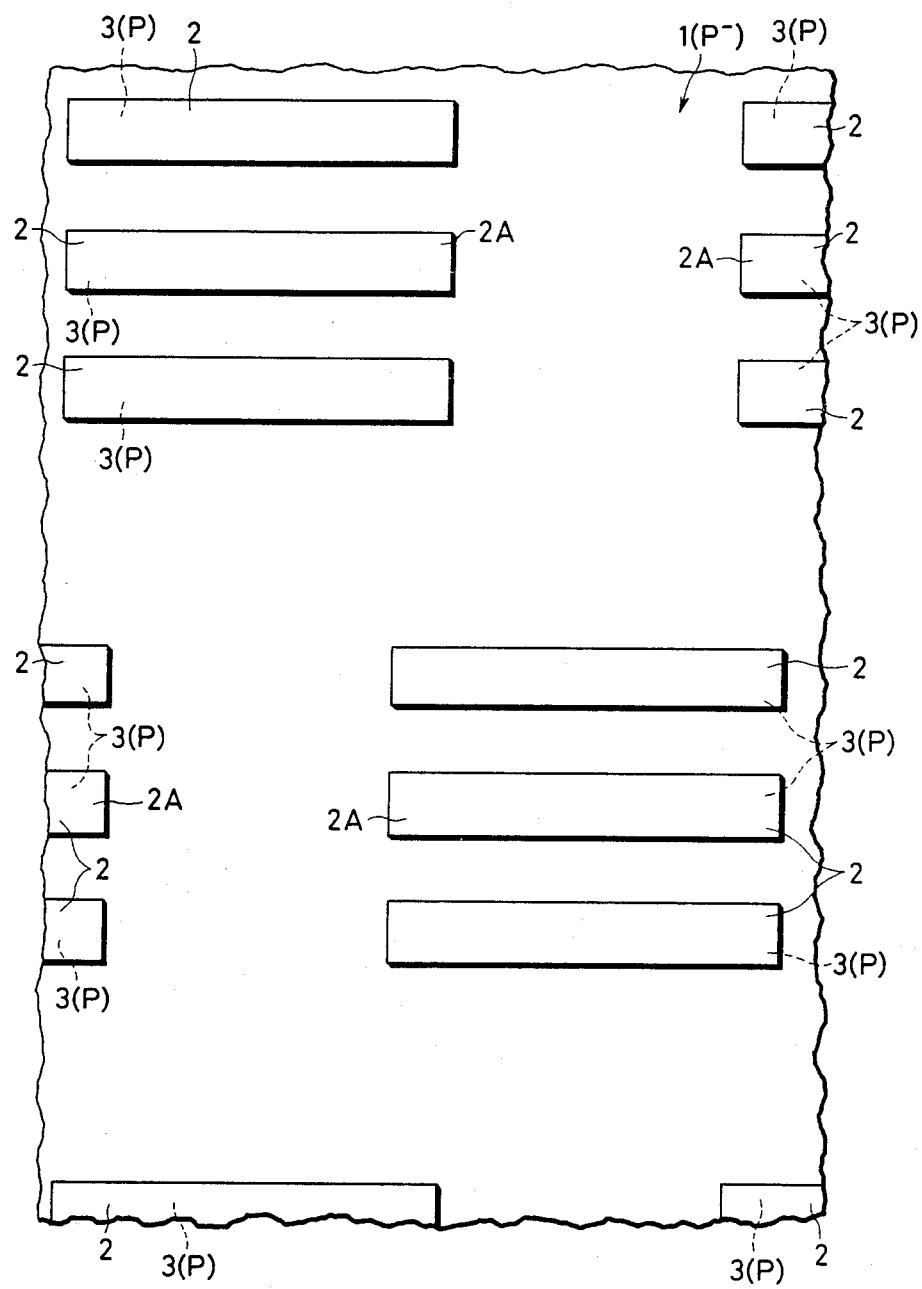
FIGS. 38 to 40 are plan views of memory cells during various manufacturing steps according to a fourth embodiment of the present invention.
Figure 39:
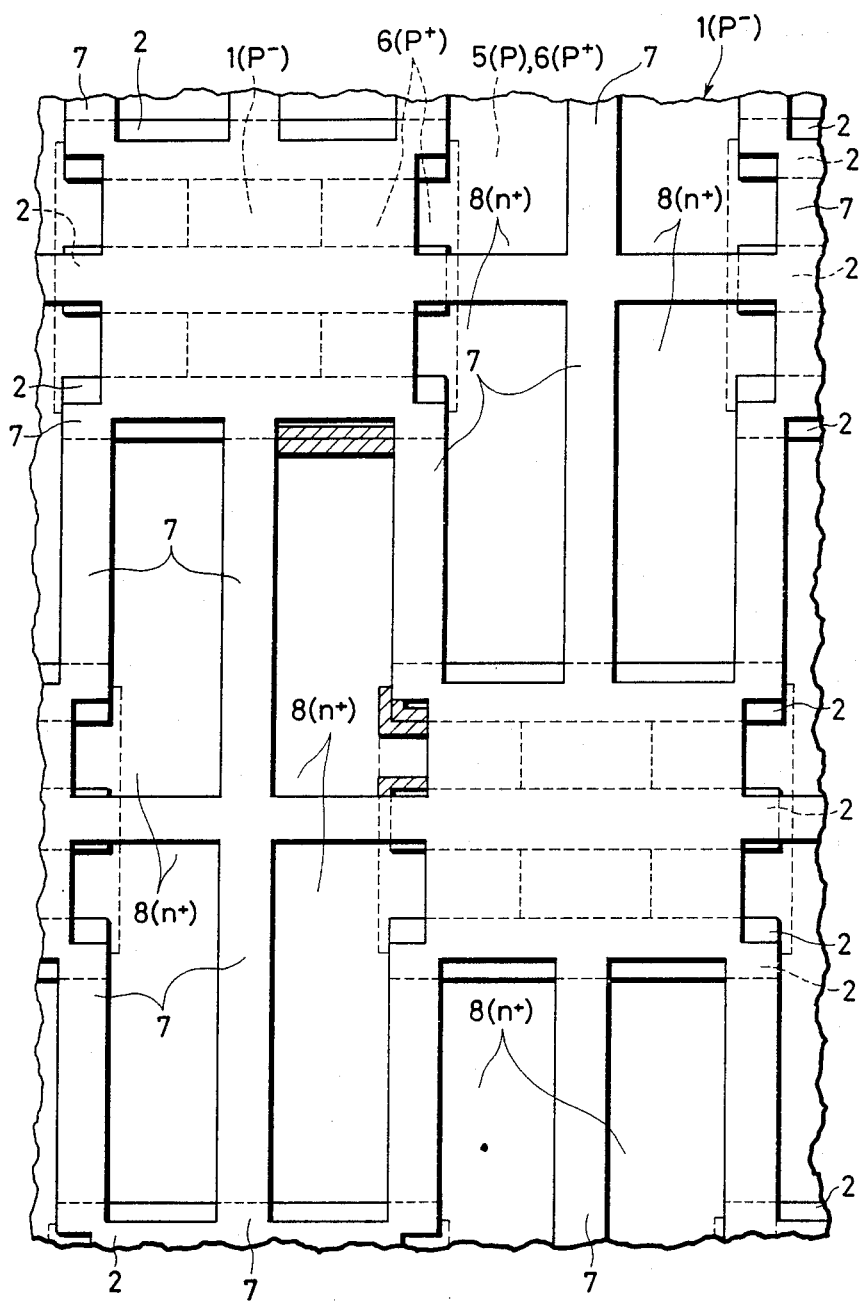
Figure 40:
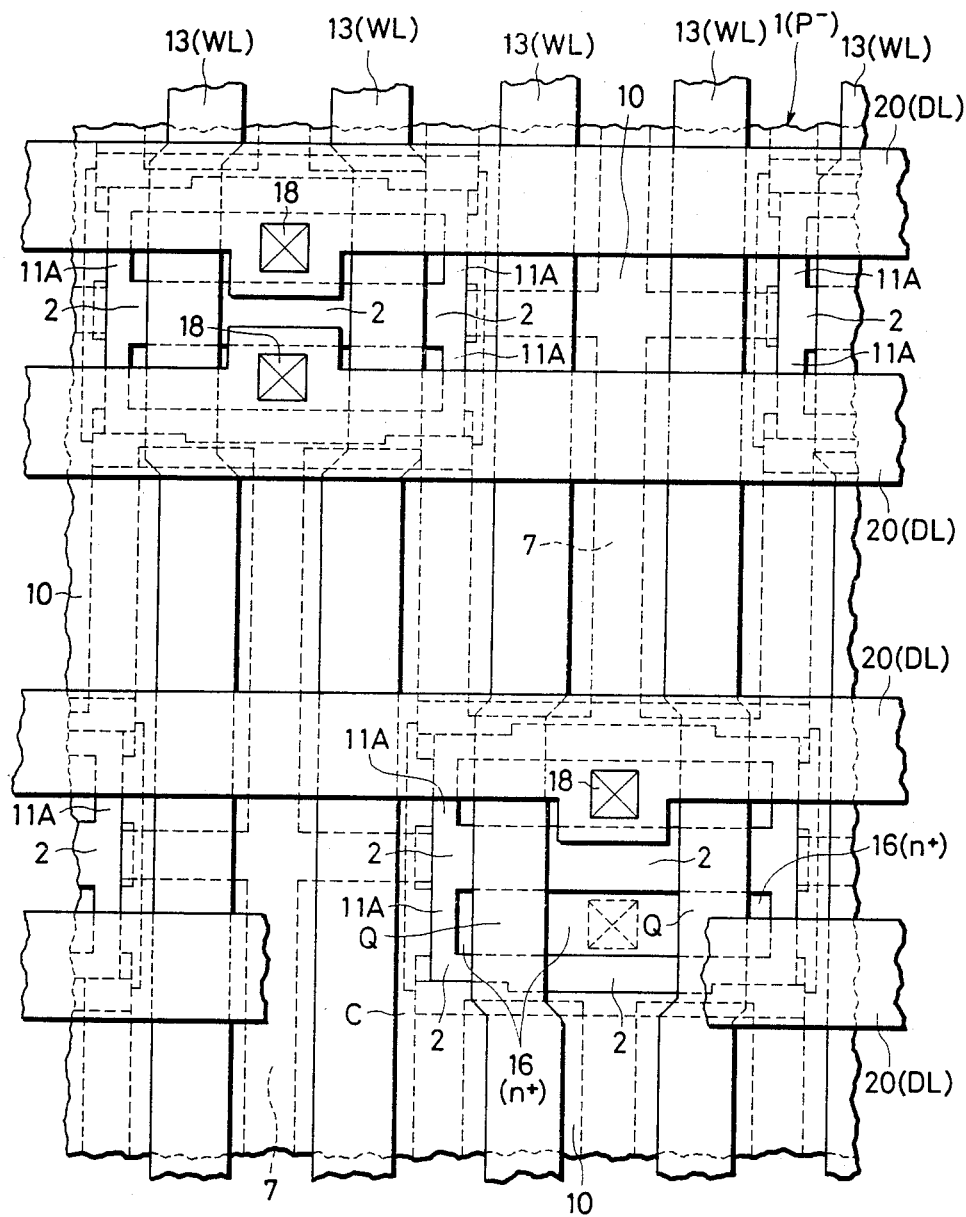

FIGS. 38 to 40 are plan views showing major portions of the memory cell array of the DRAM in each of the manufacturing steps to explain the structure and the manufacturing process according to a fourth embodiment of the present invention.

The fourth embodiment deals with another case where the memory cells of the DRAM are constituted in the L-shape.

In the fourth embodiment, the field insulating films 2 which define the gate width of the switching MISFET's are arranged maintaining nearly the same pitch in the direction in which the conductive layers 20 extend as shown in FIGS. 38 to 40. The field insulating films 2 are arranged maintaining two different pitches in the direction in which the conductive layers 13 extend. That is, the memory cell is constituted in the L-shape in which the data-storing capacitor is formed asymmetrically with respect to the switching MISFET.

A predetermined field insulating film 2 (2A) is so formed as to define the gate width of two switching MISFET's of the two neighboring memory cells that are arranged in the direction in which the conductive layers 13 extend. That is, the number of the field insulating films 2 can be halved since one field insulating film 2 defines the gate width of the two switching MISFET's of the cells arranged in the direction in which the conductive layers 13 extend, and the areas of the field insulating films 2 can be reduced.

Compared with the memory cell of the T-shape or of the shape midway between the L-shape and the T-shape, the memory cell of the L-shape provides a margin in the pitch of the conductive layers 20 for every pitch like the memory cell of the L-shape of the third embodiment, but also has strict limitations on the pitch of the conductive layers 20 for every predetermined pitch.

As shown by hatched lines in FIG. 39, furthermore, a difference develops in the size due to the field insulating films 2, and the area of the capacitor, i.e., the storage of the charge or data, decreases to some extent. The storage of charge or data decreases by an amount smaller than that of the memory cell of the T-shape of the second embodiment, than that f the memory cell of the L-shape of the third embodiment, or than that of the memory cell of the shape midway between the L-shape and the T-shape of the first embodiment.

The fourth embodiment produces nearly the same effects as the aforementioned first embodiment.

Furthermore, in the DRAM in which the memory cells are composed of series circuits of a switching MISFET and a capacitor, the memory cells are formed in the L-shape by defining a portion of the shape of the capacitor by the insulating film 7 that is formed by deposition, and by forming a portion of the shape of the switching MISFET by the field insulating film 2 that is formed by oxidizing the semiconductor substrate 1. Therefore, the storage of charge or data is reduced by an amount smaller than that of the memory cells of the T-shape or of the shape midway between the L-shape and the T-shape.

A fifth embodiment deals with the DRAM which restrains the development of soft error caused by $\alpha$ particles.

Figure 41:
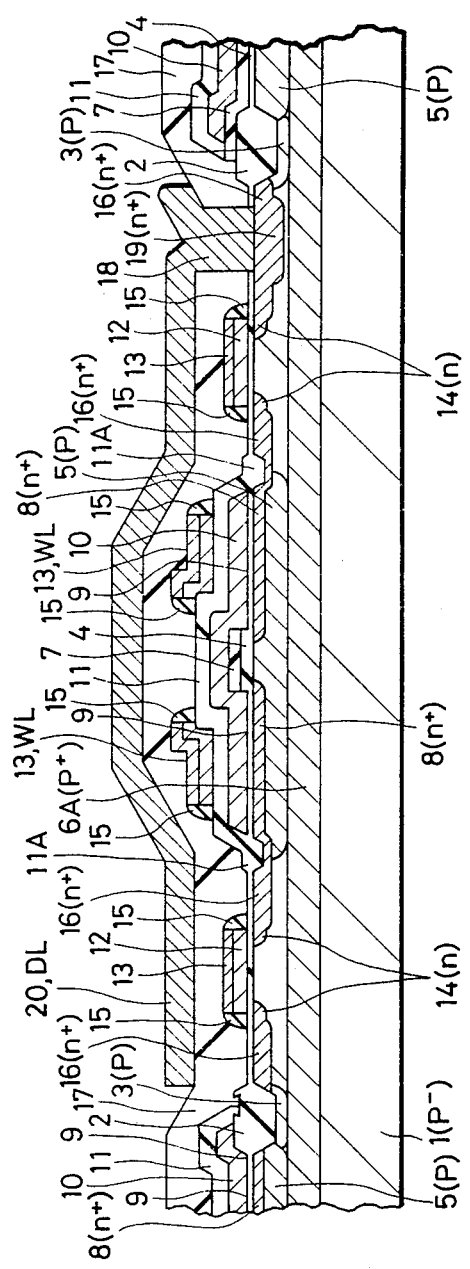
FIG. 41 is a section view of a memory cell according to a fifth embodiment of the present invention.

FIG. 41 is a section view showing major portions of the memory cell array of the DRAM to explain the fifth embodiment of the present invention.

In FIG. 41, reference numeral 6A denotes a $p^+$-type semiconductor region which is provided in the main surface of the semiconductor substrate 1 under the capacitor-forming region and the switching MISFET-forming region, i.e., which is provided on the memory cell-forming region. The semiconductor region 6A has nearly the same function as the semiconductor region 6 of the aforementioned first embodiment. The semiconductor region 6A which is provided under the switching MISFET-forming region traps, at a reduced probability, the minority carriers generated in the semiconductor substrate 1 due to $\alpha$ particles, and prevents the infiltration thereof. This further helps restrain the development of soft error in the DRAM.

The fifth embodiment produces nearly the same effects as the aforementioned first embodiment.

In the DRAM in which the memory cells are comprised of series circuits of a switching MISFET and a data-storing capacitor, furthermore, the semiconductor region 6A having an impurity concentration higher than that of the semiconductor substrate 1, is provided in the semiconductor substrate 1 under the capacitors and the switching MISFET's, thereby to constitute a potential barrier. Therefore, minority carriers produced by α particles are prevented from infiltrating into the data-storing capacitors.

This fact makes it possible to restrain the variation of electric charge, that serves as data, stored in the capacitor, and to prevent the occurrence of soft error.

Here, the semiconductor region 6A need not be provided under the field insulating film 2 in order to increase the junction breakdown voltage between the semiconductor region 16 which constitutes the switching MISFET and the semiconductor region 5 which constitutes the capacitor.

The novel technique disclosed in this application offers the effects as described below.

(1) A first insulating film is formed by deposition so as to define the shape of the capacitor. Using the thus deposited first insulating film as an oxidation impermeable mask, a second very thin insulating film is formed on the capacitor-forming region, thereby to form a capacitor. Therefore, the DRAM's can be mass-produced relying upon a planar technique which permits the processing to be easily controlled, without employing moats or trenches that are difficult to form. This makes it possible to form a capacitor with a very thin second insulating film, and to increase the amount of electric charge stored in the capacitor. This takes it possible to reduce the areas of the memory cells and, hence, to increase the degree of integration of the semiconductor integrated circuit device having a memory function.

(2) Part of the shape of the capacitor is defined by the first insulating film which is formed by deposition and which has resistance against the oxidation, and a second insulating film is formed by the first insulating film so as to cover a conductive plate. This helps eliminate the steps for forming masks that are used for forming insulating films among the conductive layers and, hence, helps reduce the number of manufacturing steps.

(3) The insulating film for defining the shape of the capacitor is used as a mask for a peripheral circuit during the step of forming the capacitor. Therefore, no additional mask is required, and the number of manufacturing steps can be reduced.

(4) Because of the facts mentioned above, the semiconductor integrated circuit device having a memory function can be realized in a highly integrated form, and can be mass-produced through a reduced number of manufacturing steps.

(5) In the semiconductor integrated device having complementary MISFET's, a semiconductor region is formed by the implantation of ions so that a portion of a semiconductor region of the n-channel MISFET will have a deep junction. This makes it possible to form the connection holes in the n-channel and p-channel MISFET-forming regions through the same manufacturing step. Therefore, the number of steps for forming the connection holes can be reduced compared with when the semiconductor region is formed by diffusion.

(6) Part of the shape of the capacitor is defined by an insulating film which is formed by deposition to reduce error in the amount of dimensional conversion thereof. Therefore, the storage of charge that serves as data decreases very little. This makes it possible to reduce the areas of the memory cells, and to increase the degree of integration and the capacity of the semiconductor integrated circuit device having a memory function.

(7) Part of the shape of the switching MISFET is defined by the field insulating film that is formed by oxidizing the semiconductor substrate. Therefore, a semiconductor region for constituting the switching MISFET of a memory cell, and a semiconductor region for constituting a data-storing capacitor of a neighboring memory cell, are formed in self-alignment relative to the field insulating film, maintaining a sufficient distance with respect thereto. This makes it possible to increase the junction breakdown voltage of the semiconductor region that serves as a source region or drain region of the switching MISFET, and to restrain the leakage between the neighboring memory cells. Therefore, the semiconductor integrated circuit device having memory function features improved electric reliability.

(8) Part of the shape of the capacitor, and a portion between the conductive layers that serve as a word line, are defined by an insulating film which is formed by deposition and which is used as an etching stopper. Therefore, any unnecessary conductive layer that was not removed by etching can be cut to prevent short-circuit between the conductive layers, contributing to improve electric reliability of the semiconductor integrated circuit device having a memory function.

(9) Part of the shape of the capacitor is defined by the insulating film formed by deposition, and part of the shape of the switching MISFET is defined by the field insulating film formed by oxidizing the semiconductor substrate. The thus defined memory cell is constituted in a shape midway between the T-shape and the L-shape. Therefore, the area is decreased little by the field insulating film compared with the memory cell of the T-shape, and margin is imparted to the pitch between the conductive layers that serve as data lines compared with the memory cell of the L-shape.

(10) The capacitor is constituted by a first semiconductor region, and a second semiconductor region of conductivity type different from that of the first semiconductor region, and the first semiconductor region is provided between the capacitors. This makes it possible to increase the threshold voltage of a parasitic MISFET, to restrain the development of parasitic channel, and to electrically isolate the data-storing capacitors from one another. Therefore, a depletion region formed between the data-storing capacitors is restrained from stretching from a portion of the pn junction, and leakage is prevented therebetween, enabling the data-storing capacitors to be isolated from one another. The first semiconductor region provided between the capacitors does not decrease the areas of the capacitors, and the storage of charge that serves as data does not decrease, either.

(11) Because of the reasons mentioned in (9) and (10) above, areas of the memory cells or among the memory cells can be reduced.

(12) The first semiconductor region for constituting the capacitor and the first semiconductor region for electrically isolating the capacitors are formed through the same step, contributing to reduce the number of steps for manufacturing the semiconductor integrated circuit devices.

(13) The first semiconductor region and the second semiconductor region which constitute the capacitor, and the first semiconductor region between the capacitors, are formed by using, as a mask for introducing the impurities, the field insulating film that is formed between the switching MISFET-forming region and the capacitor-forming region. Therefore, leakage among them is prevented, and the neighboring memory cells are electrically isolated from each other more reliably.

Namely, the semiconductor integrated circuit having a memory function features improved electric reliability.

(14) A semiconductor region of an impurity concentration higher than that of the semiconductor substrate is formed in the semiconductor substrate under the capacitor, thereby to constitute a potential barrier. Therefore, minority carriers produced by α particles are prevented from infiltrating into the capacitors, the electric charge, that serves as data, stored in the capacitor is prevented from varying, and soft error is prevented from developing.

(15) A semiconductor region of an impurity concentration greater than that of the semiconductor substrate is formed under the capacitor and under the switching MISFET other than a semiconductor region connected to the conductive layer that serves as the data line. Therefore, the parasitic capacity is not added by the semiconductor region to the conductive layer, and the semiconductor integrated circuit device operates at an increased speed.

(16) Because of the reasons mentioned in (14) and (15) above, the semiconductor integrated circuit device having a memory function operates at a increased speed without developing soft error.

(17) A second insulating film is provided on the main surface of the first semiconductor region between the data-storing capacitors, the second insulating film having a thickness greater than that of the first insulating film which constitutes the data-storing capacitor. This helps increase the threshold voltage of the parasitic MISFET constituted by the conductive plate, second insulating film and first semiconductor region, and electrically isolates the neighboring memory cells more reliably. Accordingly, the insulating film that serves as a gate insulating film of the data-storing capacitor can have a reduced thickness, and the capacitance of the capacitor can be increased.

(18) Part of the shape of the capacitor is defined by the insulating film for isolation, which comprises the first insulating film, and the second insulating film, the two films having different etching rates. Therefore, error in the amount of dimensional conversion is reduced, the thickness of the insulating film for isolation is increased, and the main surface of the semiconductor region in the capacitor-forming region is damaged very little. Therefore, the insulating film that serves as the gate insulating film to constitute the data-storing capacitor possesses good film quality.

(19) The insulating film provided between the lower conductive layer and the upper conductive layer is sandwiched by the insulating film formed by the coating technique and the insulating film formed by the plasma technique. Therefore, the lower conductive layer is prevented from undesirably moving, the upper surface of the insulating film is flattened, and resistance against humidity is improved. This enables the electric reliability of the semiconductor integrated circuit device to be improved.

In the foregoing was concretely described the invention accomplished by the inventors by way of embodiments. The invention, however, is in no way limited to the above-mentioned embodiments only but can be modified in a variety of other ways without departing from the spirit and scope of the invention.

The above-mentioned embodiments have dealt with the cases where the invention was adapted to the DRAM that employed the folded bit line system. The invention, however, can further be adapted to the DRAM which employs the open bit line system.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A semiconductor integrated circuit device, comprising series circuits including a MISFET and a capacitor, as memory cells, comprising:
    a semiconductor substrate of a first type of conductivity having a main surface;
    a first semiconductor region of a second type of conductivity formed in said semiconductor substrate and extending to said main surface, said first semiconductor region serving as one electrode of said capacitor;
    a second semiconductor region of the first type of conductivity formed under and in contact with said first semiconductor region, said second semiconductor region having an impurity concentration which is higher than the impurity concentration of said semiconductor substrate; and
    a third semiconductor region, of the first type of conductivity, formed under said second semiconductor region said third semiconductor region having an impurity concentration which is higher than the impurity concentration of said second semiconductor region.

2. A semiconductor integrated circuit device according to claim 1, wherein said third semiconductor region is formed so as to extend to a location under said MISFET in said semiconductor substrate.

3. A semiconductor integrated circuit device according to claim 2, wherein said MISFET has a source region and a drain region, one of the source and drain regions of said MISFET being electrically connected to said capacitor, and said third semiconductor region is formed so as to extend to a location under said one of the source and drain regions of said MISFET electrically connected to said capacitor.

4. A semiconductor integrated circuit device according to claim 3, wherein the other of the source and drain regions of the MISFET is electronically connected to a data line, and said third semiconductor region does not extend to a location under said other of the source and drain regions.

5. A semiconductor integrated circuit device according to claim 1, wherein said third semiconductor region has an area which is equal to, or larger than, the area of the second semiconductor region.

6. A semiconductor integrated circuit device according to claim 1, wherein the second and third semiconductor regions have impurity concentration distribution having a peak impurity concentration at a second depth and a third depth, respectively, from the main surface of the semiconductor substrate; wherein the first semiconductor region extends to a first depth from the main surface of the semiconductor substrate; and wherein either the second depth or the third depth is deeper than said first depth.

7. A semiconductor integrated circuit device, having a memory array including a plurality of memory cells arranged in first and second directions, each of said memory cells being comprised of a series circuit of a MISFET and a capacitor, said semiconductor integrated circuit device comprising:

a semiconductor substrate of a first type of conductivity having a main surface;

a first semiconductor region of a second type of conductivity formed in said semiconductor substrate and extending to said main surface, said first semiconductor region serving as one electrode of said capacitor;

a second semiconductor region of the first type of conductivity which is formed under said first semiconductor region and in a portion between said first semiconductor regions neighboring in said first direction, said second semiconductor region having an impurity concentration higher than the impurity concentration of said semiconductor substrate; and a third semiconductor region of the first type of conductivity which is formed at least under said second semiconductor region, said third semiconductor region having an impurity concentration higher than the impurity concentration of said second semiconductor region.

8. A semiconductor integrated circuit device according to claim 7, wherein said third semiconductor region is formed to extend the whole area of said memory array.

9. A semiconductor integrated circuit device according to claim 7, wherein said third semiconductor region is formed under said MISFET except under the regions that serve as a source region or drain region of said MISFET and that area connected to data lines.

10. A semiconductor integrated circuit device according to claim 7, wherein the second and third semiconductor regions have impurity concentration distributions having a peak impurity concentration at a second depth and a third depth, respectively, from the main surface of the semiconductor substrate; wherein the first semiconductor region extends to a first depth from the main surface of the semiconductor substrate; and wherein either the second depth or the third depth is deeper than said first depth.

11. A semiconductor integrated circuit device according to claim 7, wherein the third semiconductor region is in contact with the second semiconductor region.

12. A semiconductor integrated circuit device according to claim 7, wherein the third semiconductor region is spaced from the second semiconductor region.

13. A semiconductor integrated circuit device according to claim 3, further comprising:

a conductive film positioned over said main surface of said semiconductor substrate at the portion over said first semiconductor region, as another electrode of said capacitor.

14. A semiconductor integrated circuit device according to claim 13, wherein said conductive film is comprised of a polycrystalline silicon film.

15. A semiconductor integrated circuit device having a plurality of series circuits each having a MISFET and a capacity, arranged in first and second directions, as memory cells, comprising:

a semiconductor substrate of a first type of conductivity having a main surface;

two first semiconductor regions of a second type of conductivity formed in said semiconductor substrate spaced from each other and each extending to said main surface, each of said first semiconductor regions serving as one electrode of a respective one of the capacitors;

a second semiconductor region of the first type of conductivity formed under and in contact with said first semiconductor regions, said second semiconductor region having an impurity concentration which is higher than the impurity concentration of said semiconductor substrate;

a third semiconductor region, of the first type of conductivity, formed under said second semiconductor region, said third semiconductor region having an impurity concentration which is higher than the impurity concentration of said second semiconductor region; and a first insulating film over said main surface of said semiconductor substrate at a portion between said two first semiconductor regions.

16. A semiconductor integrated circuit device according to claim 15, wherein each said MISFET has a source region and a drain region, one of the source and drain regions of said MISFET being electrically connected to said capacitor, and said third semiconductor region is formed so as to extend to a location under said one of the source and drain regions of said MISFET electrically connected to said capacitor.

17. A semiconductor integrated circuit device according to claim 16, wherein the second and third semiconductor regions have impurity concentration distribution having a peak impurity concentration at a second depth and a third depth, respectively, from the main surface of the semiconductor substrate; wherein the first semiconductor region extends to a first depth from the main surface of the semiconductor substrate; and wherein either the second depth or the third depth is deeper than said first depth.

18. A semiconductor integrated circuit device according to claim 15, further comprising:

a second insulating film positioned on said main surface of said semiconductor substrate at a position over said first semiconductor regions.

19. A semiconductor integrated circuit device according to claim 18, wherein said second insulating film is comprised of a silicon oxide film.

20. A semiconductor integrated circuit device according to claim 18, further comprising:

a conductive film positioned on said second insulating film, as another electrode of said capacitors.

21. A semiconductor integrated circuit device according to claim 20, wherein said conductive film is comprised of a polycrystalline silicon film.

22. A semiconductor integrated circuit device according to claim 16, wherein a gate electrode of said MISFET is comprised of a silicide film or stacked film of a polycrystalline silicon layer and a silicide layer thereon.

23. A semiconductor integrated circuit device according to claim 22, wherein said gate electrode of said MISFET constitutes a word line extending in said first direction.

24. A semiconductor integrated circuit device according to claim 21, wherein another of the source and drain regions of the MISFET is electrically connected to a data line extending in said second direction.

25. A semiconductor integrated circuit device according to claim 13, further comprising:

a first insulating film positioned on said main surface of said semiconductor substrate at the portion over the first semiconductor region.

26. A semiconductor integrated circuit device according to claim 25, wherein said first insulating film is comprised of silicon oxide.

* * * * *